United States Patent
Kim et al.

(10) Patent No.: US 11,733,604 B2
(45) Date of Patent: Aug. 22, 2023

(54) OPTICAL PROXIMITY CORRECTION METHOD AND METHOD OF FABRICATING A SEMICONDUCTOR DEVICE USING THE SAME

(71) Applicant: Samsung Electronics Co., Ltd., Suwon-si (KR)

(72) Inventors: Gyeong Seop Kim, Hwaseong-si (KR); Noyoung Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 296 days.

(21) Appl. No.: 17/236,440

(22) Filed: Apr. 21, 2021

(65) Prior Publication Data
US 2022/0057707 A1    Feb. 24, 2022

(30) Foreign Application Priority Data

Aug. 18, 2020   (KR) .................. 10-2020-0103525

(51) Int. Cl.
*G03F 1/36*    (2012.01)
*H01L 21/027*  (2006.01)
(Continued)

(52) U.S. Cl.
CPC .............. *G03F 1/36* (2013.01); *G06F 30/392* (2020.01); *H01L 21/0274* (2013.01); *H01L 21/28518* (2013.01); *H01L 21/823814* (2013.01); *H01L 21/823821* (2013.01); *H01L 21/823828* (2013.01); *H01L 21/823871* (2013.01)

(58) Field of Classification Search
CPC .... G03F 1/36; G03F 7/70441; G03F 7/70625; H01L 21/0274; H01L 21/823814; H01L 21/823821; H01L 21/823828; H01L 21/823871; H01L 21/76816; H01L 21/823475; H01L 21/31144
See application file for complete search history.

(56) References Cited

U.S. PATENT DOCUMENTS 7,055,127 B2   5/2006  Pierrat et al.
7,901,850 B2   3/2011  Fujimura et al.
(Continued)

FOREIGN PATENT DOCUMENTS

KR   10-1677344 B1   11/2016

*Primary Examiner* — Bac H Au
(74) *Attorney, Agent, or Firm* — Harness, Dickey & Pierce, P.L.C.

(57) ABSTRACT

A method of fabricating a semiconductor device is disclosed. The method includes performing an optical proximity correction (OPC) on design patterns of a layout to generate a corrected layout, and forming a photoresist pattern on a substrate using a photomask manufactured based on the corrected layout. The OPC comprises generating develop targets for the design patterns, respectively, choosing first object patterns based on distances between the develop targets, performing a first OPC operation on the design patterns based on a mask rule to generate first correction patterns, choosing second object patterns by considering distances between the first correction patterns and a target error of each of the first correction patterns, and performing a second OPC operation on the first and second object patterns to generate second correction patterns, the performing the second OPC not based on the mask rule.

20 Claims, 35 Drawing Sheets

(51) Int. Cl.
    *H01L 21/285*     (2006.01)
    *G06F 30/392*     (2020.01)
    *H01L 21/8238*     (2006.01)

(56) References Cited

U.S. PATENT DOCUMENTS

| | | | |
|---|---|---|---|
| 8,062,810 B2 * | 11/2011 | Masanori | G03F 1/36 |
| | | | 430/311 |
| 8,739,080 B1 | 5/2014 | Tsai et al. | |
| 9,091,946 B2 | 7/2015 | Fujimura et al. | |
| 9,922,159 B2 | 3/2018 | Tiphine et al. | |
| 9,928,333 B2 * | 3/2018 | Song | H01L 27/11807 |
| 9,996,658 B2 * | 6/2018 | Kim | G06F 30/398 |
| 2005/0022150 A1 * | 1/2005 | Liu | G03F 1/36 |
| | | | 430/30 |
| 2008/0178140 A1 * | 7/2008 | Lin | G03F 1/36 |
| | | | 716/52 |
| 2013/0126977 A1 | 5/2013 | Chuang et al. | |
| 2019/0067265 A1 * | 2/2019 | Jeong | H01L 21/823871 |
| 2019/0146328 A1 | 5/2019 | Huang et al. | |
| 2019/0187552 A1 | 6/2019 | Choi et al. | |
| 2021/0104463 A1 * | 4/2021 | Lee | H01L 23/5283 |
| 2022/0179301 A1 * | 6/2022 | Lee | G03F 7/70441 |
| 2022/0179323 A1 * | 6/2022 | Kang | G06F 30/398 |

* cited by examiner

OPTICAL PROXIMITY CORRECTION METHOD AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2020-0103525, filed on Aug. 18, 2020, in the Korean Intellectual Property Office, the entire contents of which are hereby incorporated by reference.

BACKGROUND

Some example embodiments relate to a method of fabricating a semiconductor device, and in particular, to a method of fabricating a semiconductor device using an optical proximity correction (OPC) method.

Due to characteristics such as small-size, multi-functionality, and/or low-cost, semiconductor devices are being esteemed as important elements in the electronics industry. The semiconductor devices are classified into a memory device for storing data, a logic device for processing data, and a hybrid device including both of memory and logic elements. To meet the increasing demand for electronic devices with fast speed and/or low power consumption, it is desirable to realize semiconductor devices with high reliability, high performance, and/or multiple functions. To satisfy these technical requirements, complexity and/or integration density of semiconductor devices are being increased.

SUMMARY

Some example embodiments of inventive concepts provide a fast and/or efficient OPC method.

Alternatively or additionally, some example embodiments of inventive concepts provide a method of fabricating a semiconductor device, using a fast and/or efficient OPC method.

According to some example embodiments of inventive concepts, a method of fabricating a semiconductor device may include performing an optical proximity correction (OPC) on design patterns of a layout to generate a corrected layout, and forming a photoresist pattern on a substrate using a photomask manufactured based on the corrected layout. The OPC comprises generating develop targets for the design patterns, respectively, choosing first object patterns based on distances between the develop targets, performing a first OPC operation on the design patterns based on a mask rule to generate first correction patterns, choosing second object patterns by considering distances between the first correction patterns and a target error of each of the first correction patterns, and performing a second OPC operation on the first and second object patterns to generate second correction patterns, the performing the second OPC not based on the mask rule.

According to some example embodiments of inventive concepts, a method of fabricating a semiconductor device may include performing an optical proximity correction (OPC) on design patterns of a layout to generate a corrected layout, and forming a photoresist pattern on a substrate, using a photomask manufactured based on the corrected layout. The OPC comprises choosing object patterns from the design patterns, performing an OPC operation on the object patterns to generate first correction patterns, the performing the OPC operation not based on a mask rule, dividing each of the first correction patterns into a plurality of blocks, and correcting the plurality of blocks based on the mask rule to generate second correction patterns.

According to some example embodiments of inventive concepts, a method of fabricating a semiconductor device may include forming an active pattern on a substrate, forming a pair of source/drain patterns on an upper portion of the active pattern, forming a gate electrode to cross the active pattern between the pair of source/drain patterns, forming a first interlayer insulating layer to cover the pair of source/drain patterns and the gate electrode, forming an active contact to penetrate the first interlayer insulating layer and to be coupled to at least one of the pair of source/drain patterns, forming a gate contact to penetrate the first interlayer insulating layer and to be coupled to the gate electrode, forming a second interlayer insulating layer on the first interlayer insulating layer, patterning the second interlayer insulating layer to form via holes respectively exposing a top surface of the active contact and a top surface of the gate contact, filling the via holes with a conductive material to form vias, and forming interconnection lines, which are connected to the vias, on the second interlayer insulating layer. The forming of the via holes includes designing a layout in which design patterns defining the vias are included, performing an optical proximity correction (OPC) on the designed layout to generate a corrected layout, and performing a photolithography process on the second interlayer insulating layer using a photomask manufactured based on the corrected layout. The OPC includes generating develop targets for the design patterns, choosing first object patterns based on distances between the develop targets, performing a first OPC operation on the design patterns based on a mask rule to generate first correction patterns, choosing second object patterns by considering distances between the first correction patterns and a target error of each of them, and performing a second OPC operation on the first and second object patterns, without being based on the mask rule, to generate second correction patterns.

BRIEF DESCRIPTION OF THE DRAWINGS

Some example embodiments will be more clearly understood from the following brief description taken in conjunction with the accompanying drawings. The accompanying drawings represent non-limiting, some example embodiments as described herein.

DETAILED DESCRIPTION OF SOME EXAMPLE EMBODIMENTS

Figure 1:
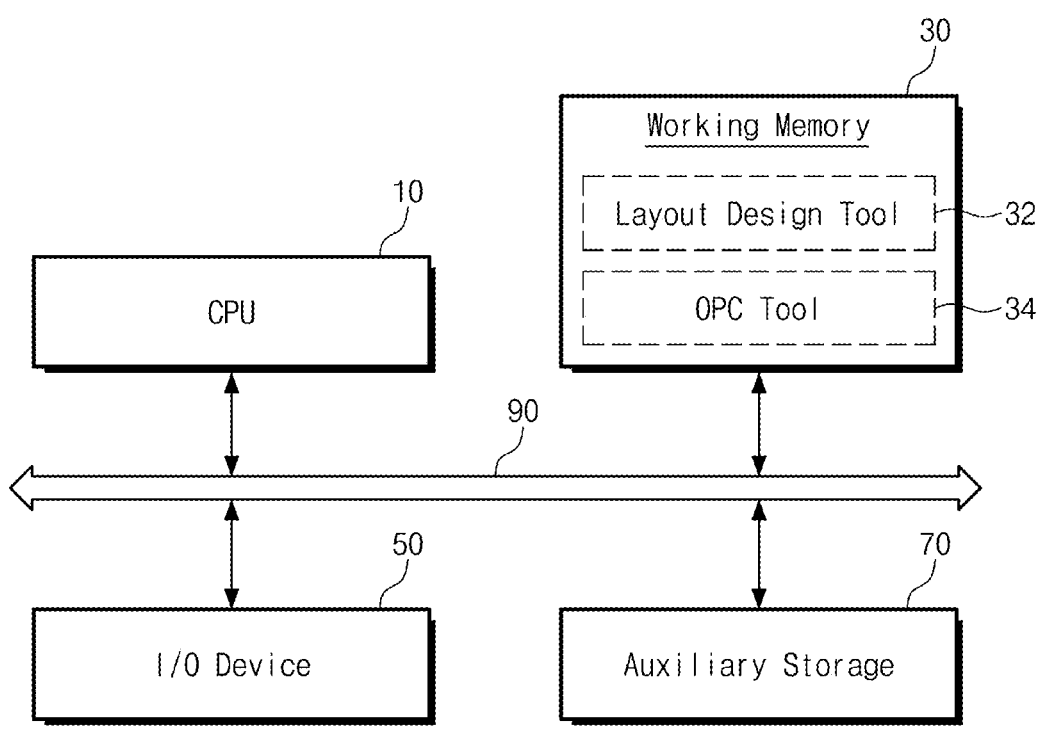
FIG. 1 is a block diagram illustrating a computer system for performing a semiconductor design process, according to some example embodiments of inventive concepts.

FIG. 1 is a block diagram illustrating a computer system for performing a semiconductor design process, according to some example embodiments of inventive concepts. Referring to FIG. 1, a computer system may include a central processing unit (CPU) 10, a working memory 30, an input-output device 50, and an auxiliary storage device 70. In some example embodiments, the computer system may be a customized system for performing a layout design process according to some example embodiments of inventive concepts. Alternatively or additionally, in some example embodiments the computer system may be a general-purpose system capable of preforming a layout design process according to some example embodiments of inventive concepts. Furthermore, the computer system may include a computing system configured to execute various design and check simulation programs.

The CPU 10 may be configured to run a variety of software programs, such as application programs, operating systems, and/or device drivers. For example, the CPU 10 may be configured to run an operating system (not shown) loaded on the working memory 30. Furthermore, the CPU 10 may be configured to run various application programs on the operating system. For example, the CPU 10 may be configured to run a layout design tool 32 and/or OPC tool 34 loaded on the working memory 30. Additionally or alternatively, although the layout design tool 32 and the OPC tool 34 are illustrated as being separate components, example embodiments are not limited thereto. For example, a tool may perform both layout designs and OPC.

The operating system or application programs may be loaded on the working memory 30. For example, when the computer system starts a booting operation, an OS image (not shown) stored in the auxiliary storage device 70 may be loaded on the working memory 30 according to a booting sequence. In the computer system, overall input/output operations may be managed by the operating system. Some application programs, which may be selected by a user or be provided for basic services, may be loaded on the working memory 30. According to some example embodiments of inventive concepts, the layout design tool 32 and/or OPC tool 34 may be loaded on the working memory 30, from the auxiliary storage device 70.

The layout design tool 32 may provide a function for changing biasing data for specific layout patterns such as specific polygons in a layout; for example, the layout design tool 32 may be configured to allow the specific layout patterns to have shapes and/or positions different from those defined by a design rule. The layout design tool 32 may be configured to perform a design rule check (DRC) under the changed condition of the bias data. The layout design tool 32 may perform a dummy-fill operation, wherein dummy patterns are added and/or removed to improve the manufacturability of the semiconductor device. The OPC tool 34 may be configured to perform an optical proximity correction (OPC) process on layout data, which is obtained by the layout design tool 32. The working memory 30 may be at least one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

The input-output device 50 may be configured to control user input and output operations of user interface devices. For example, the input-output device 50 may include a touch-pad and/or a mouse and/or a keyboard and/or a monitor such as a touch-screen monitor, allowing a designer to input relevant information. By using the input-output device 50, the designer may receive information on several regions or data paths, to which adjusted operating characteristics will be applied, of a semiconductor device. The input-output device 50 may be configured to display a progress status or a process result of the OPC tool 34.

The auxiliary storage device 70 may serve as a storage medium for the computer system. The auxiliary storage device 70 may be configured to store at least one of application programs, an OS image, and various data. The auxiliary storage device 70 may be provided in the form of one of memory cards (e.g., MMC, eMMC, SD, MicroSD, and so forth) or a hard disk drive (HDD). The auxiliary storage device 70 may include a NAND FLASH memory device with a large memory capacity. Alternatively or additionally, the auxiliary storage device 70 may include at least one of next-generation nonvolatile memory devices (e.g., PRAM, MRAM, ReRAM, or FRAM) or NOR FLASH memory devices.

A system interconnector 90 may serve as a system bus for realizing a network in the computer system. The CPU 10, the working memory 30, the input-output device 50, and the auxiliary storage device 70 may be electrically connected to each other through the system interconnector 90, and thus, data may be exchanged therebetween. However, the system interconnector 90 may not be limited to the afore-described configuration; for example, the system interconnector 90 may further include an additional element for increasing efficiency in data communication.

Figure 2:
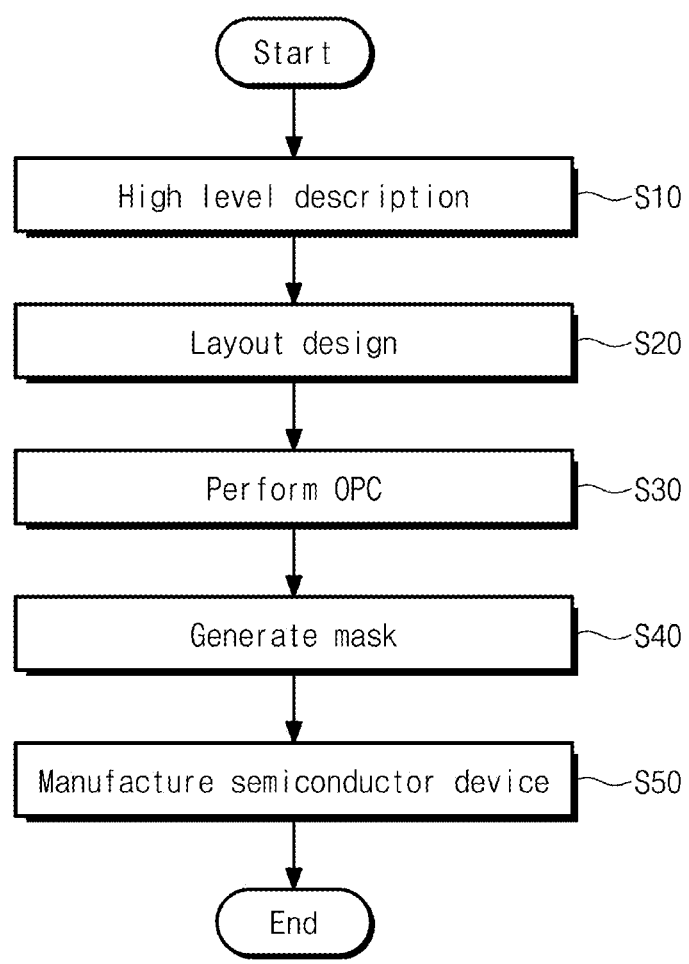
FIG. 2 is a flow chart illustrating a method of designing and fabricating a semiconductor device, according to some example embodiments of inventive concepts.

FIG. 2 is a flow chart illustrating a method of designing and fabricating a semiconductor device, according to some example embodiments of inventive concepts.

Referring to FIG. 2, a high-level design process for a semiconductor integrated circuit may be performed using the computer system described with reference to FIG. 1 (in S10). For example, in the high-level design process, an integrated circuit to be designed may be described in terms of high-level computer language (e.g., C language). Circuits designed by the high-level design process may be more concretely described by a register transfer level (RTL)

coding or a simulation. The RTL coding may be based on a hardware description language, such as VHDL and/or Verilog. Furthermore, codes generated by the RTL coding may be converted into a netlist, and the results may be combined with each other to wholly describe a semiconductor device. The combined schematic circuit may be verified by a simulation tool, such as a SPICE simulation tool. In some example embodiments, an adjusting step may be further performed, in consideration of a result of the verification step.

A layout design process may be performed to realize a logically complete form of the semiconductor integrated circuit on a silicon wafer (in S20). For example, the layout design process may be performed, based on the schematic circuit prepared in the high-level design process or the corresponding netlist. The layout design process may include a routing step of placing and connecting various standard cells that are provided from a cell library, based on a predetermined design rule. The routing step may be or correspond to a Placement and Routing (P and R) step.

The cell library may contain information on at least one of operation, speed, and power consumption of cells. In some example embodiments, a cell library for representing a layout of a circuit in a gate level may be defined in and/or by the layout design tool. Here, the layout may be prepared to define or describe at least one of shapes, positions, or dimensions of patterns constituting/corresponding to transistors and metal interconnection lines, which will be actually formed on a substrate such as a silicon wafer. For example, in order to actually form an inverter circuit on a substrate, it may be necessary or desirable to prepare or draw a layout for patterns (e.g., PMOS, NMOS, N-WELL, gate electrodes, and/or metal interconnection lines thereon). For this, at least one of inverters defined in the cell library may be selected.

Furthermore, a routing step of connecting the selected cells to each other may be performed. In detail, the routing step may be performed on the selected and disposed standard cells to connect them to upper interconnection lines. These steps may be automatically and/or manually performed in the layout design tool. In some example embodiments, a step of placing the standard cells and establishing routing structures thereto may be automatically performed by a Place & Routing tool.

After the routing step, a verification step may be performed on the layout to check whether there is a portion violating the given design rule. In some example embodiments, the verification step may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S30). The OPC step may be performed to correct optical proximity effects, which may occur when a photolithography process is performed on a substrate using a photomask manufactured taped out/based on the layout. An optical proximity effect may correspond to or be an unintended optical effect (such as refraction and/or diffraction) which may occur in the exposing process using the photomask manufactured based on the layout. In the OPC step, the layout may be modified to have a reduced difference in shape between designed patterns and actually-formed (as-formed) patterns, which may be caused by the optical proximity effects. As a result of the OPC step, the shapes and/or positions of patterns in the designed layout may be changed and/or biased. The OPC step will be described in more detail with reference to FIGS. 3 to 8.

A photomask may be manufactured, based on the layout modified by the OPC step (in S40). In general, the photomask may be manufactured by transferring/patterning a metal layer such as a chromium layer provided on a substrate such as glass substrate, using the layout pattern data. The transferring/patterning may include etching the chromium layer and/or performing an electron-beam writing process; however, example embodiments are not limited thereto. Alternatively or additionally the photomask may be manufactured to have phase-shifting features. Furthermore, the transferring/patterning of the layout modified by the OPC step may be or correspond to a tape-out process.

The manufactured photomask may be used to manufacture/fabricate a semiconductor device (in S50). In the actual fabricating process, the exposing and etching steps may be iteratively and repeatedly performed, and thus, patterns defined in the layout design process may be sequentially formed on a semiconductor substrate. Alternatively or additionally, the manufactured photomask may be used to expose a pattern and implant impurities into layers of the semiconductor device. Furthermore the manufactured photomask may be used for one or more of layers of the semiconductor device. For example, one manufactured photomask may be used for one layer of the semiconductor device, and another manufactured photomask may be used for another layer of the semiconductor device.

Figure 3:
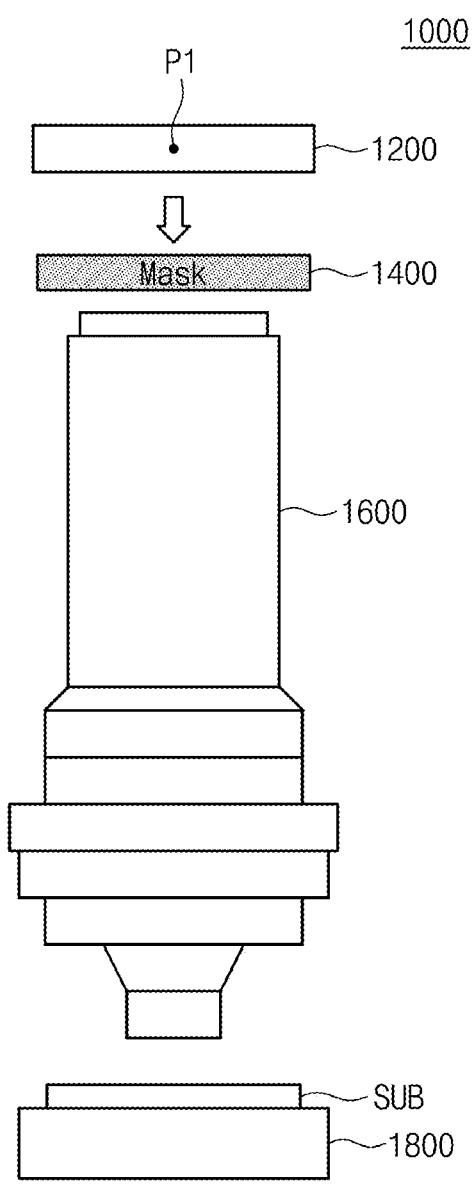
FIG. 3 is a conceptual diagram illustrating a photolithography system, in which a photomask according to some example embodiments of inventive concepts is used.

FIG. 3 is a conceptual diagram illustrating a photolithography system, in which a photomask according to some example embodiments of inventive concepts is used. A photolithography system 1000 may include a light source 1200, a photomask 1400, a reduction projection apparatus 1600, and a substrate stage 1800. Although not illustrated in FIG. 3, some additional elements may be provided in the photolithography system 1000. For example, the photolithography system 1000 may further include a sensor for measuring a height and/or a slope of a top surface of a substrate SUB.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be a KrF light source such as a krypton-fluoride excimer laser (at a wavelength of 234 nm), an ArF light source such as an argon-fluoride excimer laser (at a wavelength of 193 nm), and/or an extreme ultraviolet (EUV) light source configured to emit light at about 13.5 nm wavelength. Preferably, the light source 1200 according to some example embodiments of inventive concepts may be the EUV light source. The light source 1200 may include a single point light source P1, but example embodiments are not be limited thereto. In some example embodiments, the light source 1200 may be configured to have a plurality of point light sources.

The photomask 1400 may include image patterns, which are used to transcribe and/or print and/or transfer the designed layout onto the substrate SUB. The image patterns may be formed based on layout patterns, which are prepared through layout design and OPC steps described above. The image patterns may be defined by transparent and opaque regions formed on the photomask 1400. The transparent region may be formed by removing/etching the metal layer (e.g., the chromium layer) that is provided on the photomask 1400. The transparent region may be configured to allow light, which is incident from the light source 1200, to propagate toward the substrate SUB. By contrast, the opaque region may be configured to at least partially prevent or block the light from propagating toward the substrate SUB.

The light passing through the transparent region of the photomask 1400 may be incident into a photoresist layer, which is formed on the substrate SUB, through the reduction projection apparatus 1600, and as a result, photoresist patterns may be formed on the substrate SUB. The photoresist patterns may have shapes corresponding to the image patterns of the photomask 1400. For example, by using the reduction projection apparatus 1600, it may be possible to form the photoresist patterns, whose shapes are defined by the image patterns of the photomask 1400, on the substrate SUB. The shapes may correspond to the transparent regions of the photomask; alternatively, the shapes may correspond to the opaque features of the photomask.

The substrate stage 1800, e.g. a pedestal, may be configured to support the substrate SUB. The substrate SUB may include, for example, a silicon wafer. The reduction projection apparatus 1600, e.g. optics, may include an aperture. The aperture may be used to control a depth of focus, when the ultraviolet light emitted from the light source 1200 is incident onto the substrate SUB. As an example, the aperture may include a dipole or quadruple aperture. The reduction projection apparatus 1600 may further include a lens for controlling a focal length. Furthermore although not illustrated, there may be a bead of liquid, such as a bead of water and/or oil, between the reduction projection apparatus 1600 and the substrate SUB. The bead of liquid may affect, e.g. improve, the numerical aperture (NA) of the reduction projection apparatus 1600. The reduction projection apparatus 1600 may be an immersion apparatus.

As an integration density of a semiconductor device increases, a distance between the image patterns within the photomask 1400 may be reduced, thereby causing a proximity issue such as undesired interference and/or diffraction. As a result of the proximity issue, the photoresist patterns formed on the substrate SUB may have distorted shapes (e.g., may be different from those of the image patterns of the photomask 1400). The distortion of the photoresist patterns may lead to malfunction of an electronic device and/or circuit to be formed on the substrate SUB.

A resolution enhancement technology may be used to prevent or reduce the impact of the distortion of the photoresist patterns. An OPC technology, which is used in the step S30 of FIG. 2, may be an example of the resolution enhancement technology (RET). According to the OPC technology, the optical distortion issue, which is caused by interference and/or diffraction, may be quantitatively predicted by a simulation process using an OPC model. The designed layout may be corrected and/or biased, based on the predicted result. Based on the corrected layout, image patterns may be formed on the photomask 1400, and in the case where the photomask 1400 is manufactured by this method, the photoresist patterns may be formed in desired shapes on the substrate SUB.

A layout of a semiconductor device may include a plurality of layers. In some example embodiments, the OPC step may be performed to correct a layout for each of the layers. For example, the OPC step may be independently performed on each of the plurality of layers. A semiconductor device may be fabricated by forming the plurality of layers on a substrate through a semiconductor process. As an example, a semiconductor device may include a plurality of stacked metal layers constituting/corresponding to a specific circuit.

Figure 4:
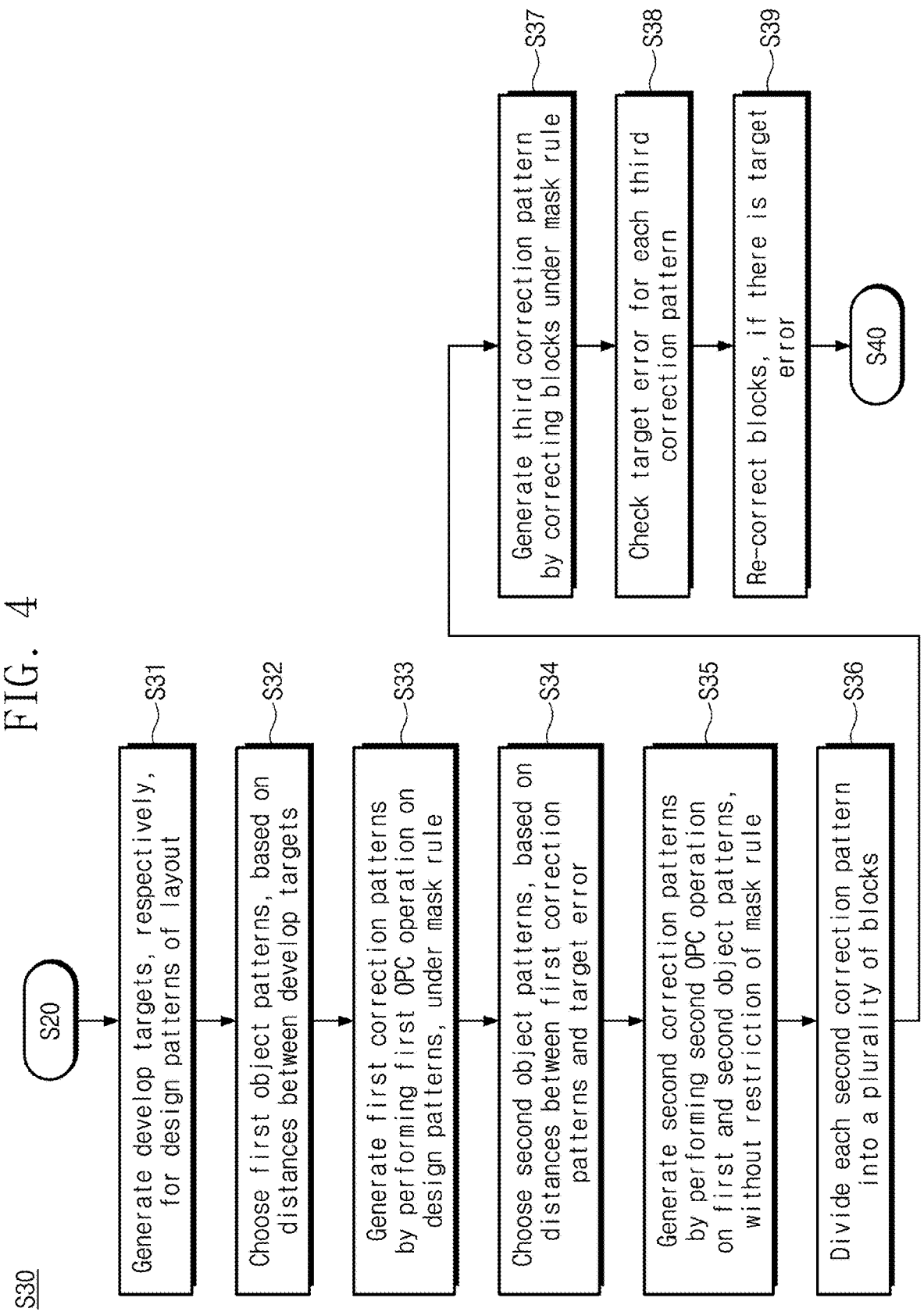
FIG. 4 is a flow chart schematically illustrating some steps in an optical proximity correction process according to some example embodiments of inventive concepts.

FIG. 4 is a flow chart schematically illustrating some steps in an optical proximity correction process according to some example embodiments of inventive concepts. FIGS. 5 to 13 are layout diagrams illustrating the optical proximity correction process of FIG. 4.

Figure 5:
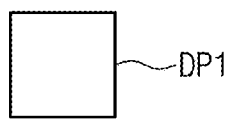
FIGS. 5 to 13 are layout diagrams illustrating the optical proximity correction process of FIG. 4.
Figure 5:
Figure 5:
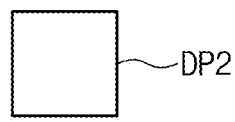
Figure 5:
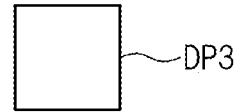
Figure 5:
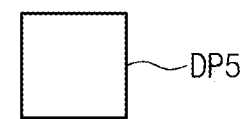
Figure 5:
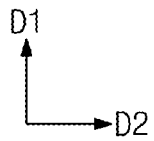
Figure 5:

Referring to FIGS. 4 and 5, a layout LO, which is produced by the layout design process S20 previously described with reference to FIG. 2, may be provided. The layout LO may be or correspond to a layout of a single layer. For example, the layout LO of FIG. 5 may be a layout which defines a single via layer constituting/corresponding to an interconnection layer.

The layout LO may include first to sixth design patterns DP1-DP6. As an example, the first to sixth design patterns DP1-DP6 may have the same shape and size. As another example, although not shown, at least two patterns of the first to sixth design patterns DP1-DP6 may have shapes and/or sizes different from each other.

Figure 6:
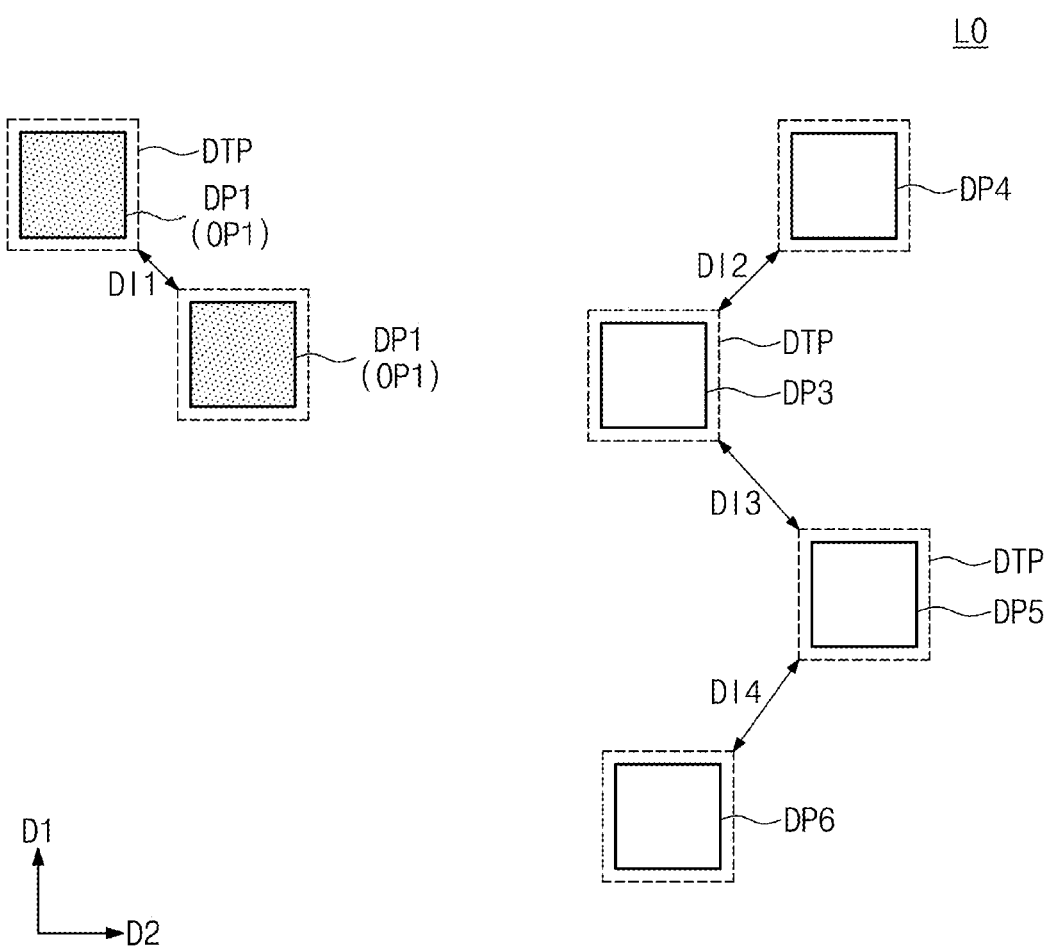

Referring to FIGS. 4 and 6, develop targets DTP may be respectively generated for the first to sixth design patterns DP1-DP6 (in S31). The develop target DTP may be generated from a design pattern corresponding thereto through a table driven layout operation (TDLO). The develop target DTP may define a size of a pattern (e.g., a photoresist pattern), which will be formed by developing a photoresist layer during a photolithography process. For example, the develop target DTP may define a desired size of a photoresist pattern which will be actually formed/patterned by the developing step.

According to some example embodiments of inventive concepts, the design pattern may define a size of a final pattern, which will be formed in an etching target layer below the photoresist pattern. The final pattern, which will be formed in the etching target layer, may have a size, such as a circumference, perimeter, diameter or major or minor axis, and/or area, that is smaller than the size of the photoresist pattern formed by the photolithography process. This may be because the etching target layer is patterned to have an inclined etching profile when the etching target layer is etched using the photoresist pattern as an etch mask. Accordingly, the generation of the develop target DTP (in S31) may be a process of correcting a difference between the size of the photoresist pattern, which is formed by developing the photoresist layer, and a size of the pattern, which is formed in (e.g. at the lower end of) the etching target layer.

After the generation of the develop targets DTP, first object patterns may be chosen by measuring short distances such as the shortest distance between adjacent ones of the develop targets DTP (in S32). Specifically, a distance between a corner/chamfer/bevel of the develop target DTP and a corner/chamfer/bevel of another develop target DTP adjacent thereto may be measured. For example, a distance between the develop target DTP of the first design pattern DP1 and the develop target DTP of the second design pattern DP2 may be measured as a first distance DI1. A distance between the develop target DTP of the third design pattern DP3 and the develop target DTP of the fourth design pattern DP4 may be measured as a second distance DI2. A distance between the develop target DTP of the third design pattern DP3 and the develop target DTP of the fifth design pattern DP5 may be measured as a third distance DI3. A distance between the develop target DTP of the fifth design pattern DP5 and the develop target DTP of the sixth design pattern DP6 may be measured as a fourth distance DI4.

A mask rule check may be performed to examine whether each of the measured first to fourth distances DI1, DI2, DI3, and DI4 individually or collectively meets a mask rule. The mask rule may be prepared to define the shortest distance allowed between image patterns, which will be formed in the photomask 1400 of FIG. 3.

For example, one (e.g., the first distance DI1) of the first to fourth distances DI1, DI2, DI3, and DI4 may not meet the mask rule. For example, the second to fourth distances DI2, DI3, and DI4 may be greater than or equal to the value allowed by the mask rule (hereinafter, 'mask rule value'), whereas the first distance DI1 may be less than the mask rule value. In this case, the first and second design patterns DP1 and DP2, which are associated with the first distance DI1, may be chosen as first object patterns OP1. The second to fourth distances DI2, DI3, and DI4 may be excluded from the first object pattern, because they are greater than or equal to that in the mask rule, and do not violate the mask rule.

In some example embodiments, the first object patterns OP1 may be chosen by examining whether each of or any of the first to fourth distances DI1, DI2, DI3, and DI4 is less than a sum of the value specified by the mask rule and an additional value a. Here, the additional value a may be given to express a marginal space for an OPC correction and may be changed depending on an OPC model or recipe or a layer property.

Figure 7:
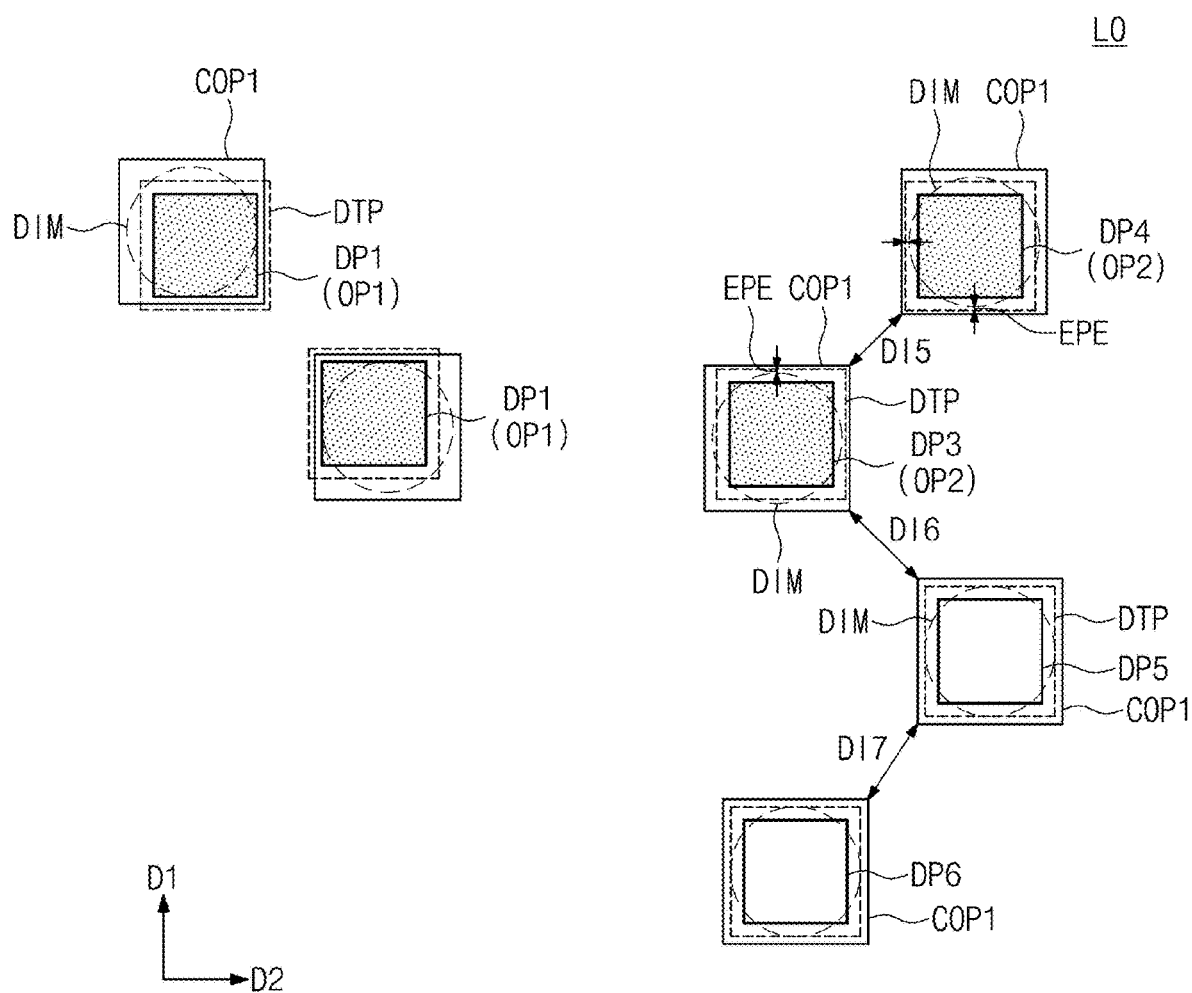

Referring to FIGS. 4 and 7, first correction patterns COP1 may be generated by performing a first OPC operation on the first to sixth design patterns DP1-DP6 based on, e.g. under, the mask rule (in S33).

In more detail, the first correction pattern COP1 may be generated for each of the first to sixth design patterns DP1-DP6, based on the previously-generated develop target DTP. The first correction pattern COP1 may have or lead to a develop image DIM, which is generated through a simulation process (such as an optical simulation process) using an OPC model. The first correction pattern COP1 may be generated through the OPC simulation process such that the develop image DIM conforms, e.g. overlaps or maximally conforms to the develop target DTP in size and/or position. For example, the OPC simulation process may calculate a figure of merit, such as a root-mean-squared error, between the develop image DIM and the develop target DTP. During the first OPC operation, the first correction patterns COP1 may be generated such that the shortest distances between them meet the mask rule.

Second object patterns OP2 may be chosen in consideration of distances such as the shortest distance between the first correction patterns COP1, which are generated through the first OPC operation, and a target error (in S34). In detail, a distance between corners of adjacent ones of the first correction patterns COP1 may be measured.

For example, a distance between the first correction patterns COP1 of the third and fourth design patterns DP3 and DP4 may be measured as a fifth distance DI5. Since the first OPC operation is performed such that the first correction pattern COP1 meets the mask rule, the fifth distance DI5 may be greater than or equal to the mask rule value. However, to meet the mask rule, the first correction patterns COP1 of the third and fourth design patterns DP3 and DP4 may be generated to be offset from centers of the corresponding develop targets DTP. Thus, the develop image DIM of the third design pattern DP3 may be offset from the center of the develop target DTP corresponding thereto, i.e. corresponding to the third design pattern DP3. The develop image DIM of the fourth design pattern DP4 may be offset from the center of the develop target DTP corresponding thereto, i.e. corresponding to the fourth design pattern DP4.

Since the develop image DIM is offset from the develop target DTP, a target error EPE may occur. The target error EPE may be given as a distance such as the shortest distance between the develop image DIM and the develop target DTP, when the develop image DIM is not in contact with the develop target DTP. In the case where the target error EPE is greater than a specific value required in the OPC operation, the design patterns associated with the target error EPE may be chosen as the second object patterns OP2.

The fifth distance DI5 between the first correction patterns COP1 of the third and fourth design patterns DP3 and DP4 may have a relatively small value that is close to the mask rule value, and in this case, the target error EPE between the develop image DIM and the develop target DTP may be associated with each of the third and fourth design patterns DP3 and DP4. Thus, the third and fourth design patterns DP3 and DP4 may be chosen as the second object patterns OP2.

A distance between, e.g. a distance between nearest corners of, the first correction pattern COP1 of the fifth design pattern DP5 and the first correction pattern COP1 of the third design pattern DP3 may be measured as a sixth distance DI6. A distance between, e.g. a distance between nearest corners of, the first correction pattern COP1 of the fifth design pattern DP5 and the first correction pattern COP1 of the sixth design pattern DP6 may be measured as a seventh distance DI7. Each of the sixth and seventh distances DI6 and DI7 may be relatively large, compared with the mask rule value. Since the distance between the first correction patterns COP1 is relatively large, the target error EPE between each of the develop images DIM of the fifth and sixth design patterns DP5 and DP6 and the develop target DTP may be zero or may be less than the specific value. Thus, the fifth and sixth design patterns DP5 and DP6 may not be chosen as the second object patterns OP2. In other words, an additional OPC operation may not be required for the fifth and sixth design patterns DP5 and DP6, and the OPC operation may be finished. For example, the first correction patterns COP1 generated by the first OPC operation may be provided as final correction patterns.

Subsequently, an additional OPC operation according to some example embodiments of inventive concepts may be performed on design patterns DP1-DP4, which are chosen as the first and second object patterns OP1 and OP2.

Figure 8:
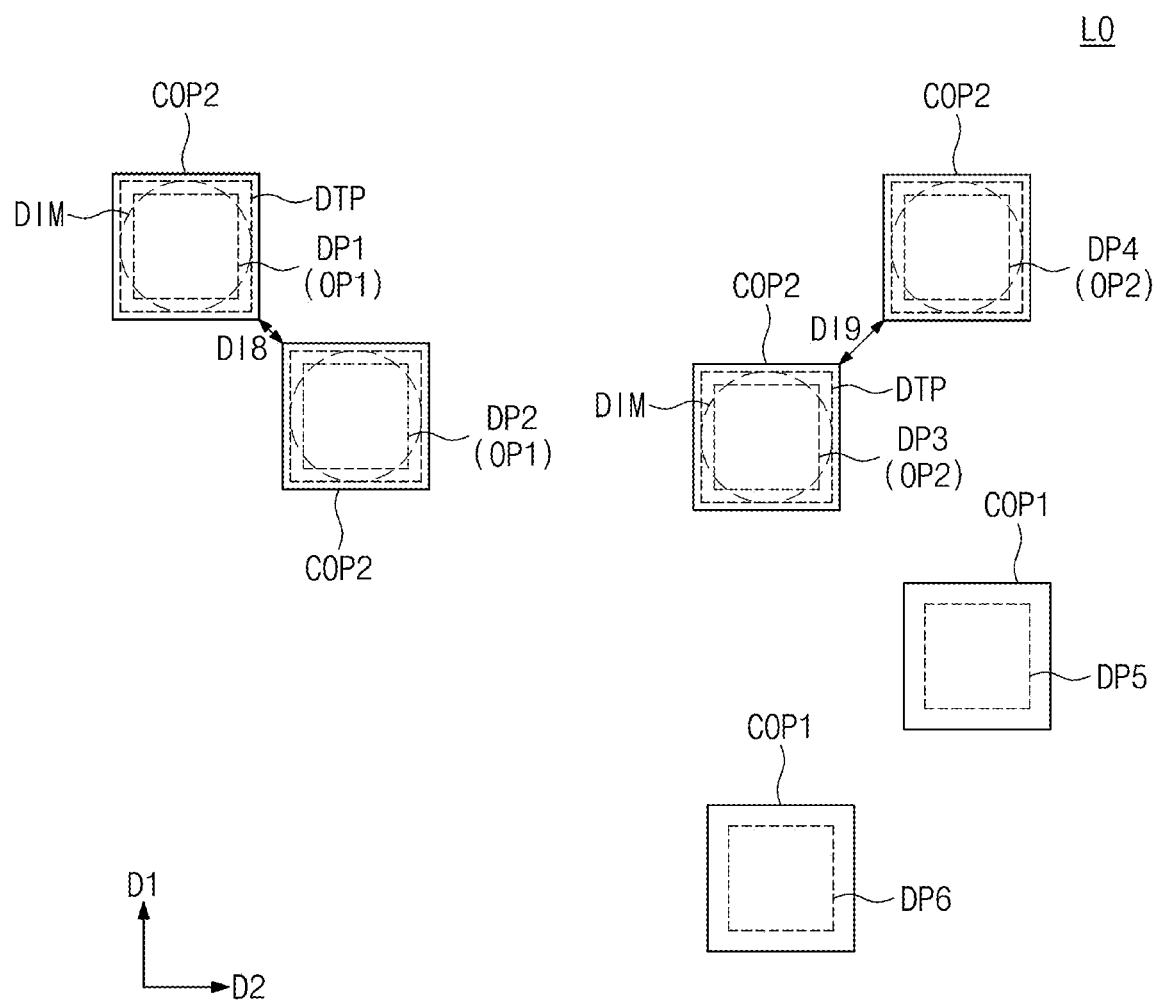

Referring now to FIGS. 4 and 8, second correction patterns COP2 may be generated by performing a second OPC operation on the first and second object patterns OP1 and OP2 without the restriction of or consideration of, or without being based on, the mask rule (in S35).

In detail, the second correction pattern COP2 may be generated for each of the first to fourth design patterns DP1-DP4 chosen as the first and second object patterns OP1 and OP2, based on the previously-generated develop target DTP. The second correction pattern COP2 may be generated such that the develop image DIM generated by the OPC simulation process conforms to/sufficiently overlaps with the develop target DTP in their size and/or position.

Unlike the first OPC operation described above, the second correction patterns COP2 may be generated without the restriction of/without being based on/without consideration of the mask rule. Thus, each of the develop images DIM may be generated such that the develop images DIM have no target error with the develop target DTP corresponding thereto. However, the shortest distance between adjacent ones of the second correction patterns COP2 may be less than the mask rule value. For example, an eighth distance DI8 between the second correction pattern COP2 of the first design pattern DP1 and the second correction pattern COP2 of the second design pattern DP2 may be smaller than the mask rule value. A ninth distance DI9 between the second correction pattern COP2 of the third design pattern DP3 and the second correction pattern COP2 of the fourth design pattern DP4 may be smaller than the mask rule value.

Meanwhile, the second OPC operation may not be performed on the fifth and sixth design patterns DP5 and DP6, which are excluded from the first and second object patterns OP1 and OP2. Accordingly, a reduction in the number of objects, to which the OPC operation to be described below will be applied may be achieved, and therefore a reduction in an operation time of the OPC operation may be achieved.

Figure 9:
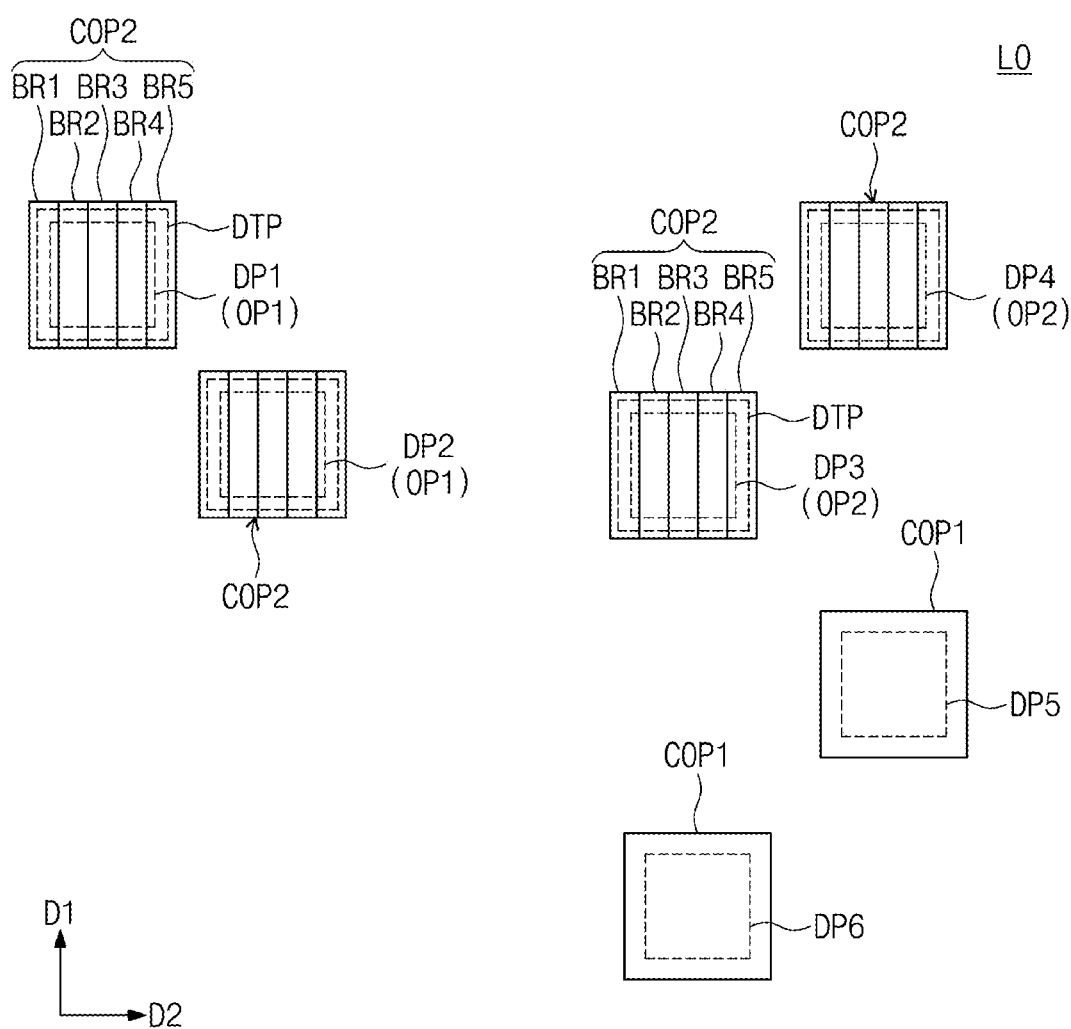

Referring to FIGS. 4 and 9, each of the generated second correction patterns COP2 may be divided into a plurality of blocks (in S36). The process of dividing the second correction pattern COP2 into the blocks may be defined as a fracture & Manhattanize process. In detail, each of the second correction patterns COP2 may be divided into first to fifth blocks BR1-BR5.

In some example embodiments, all of the first to fifth blocks BR1-BR5 may be divided to have the same size. However, the inventive concept is not limited to this example. Although not shown, in some example embodiments, the first to fifth blocks BR1-BR5 may have different sizes from each other. Alternatively or additionally, the first to fifth blocks BR1-BR5 may have different shapes from each other.

Figure 10:
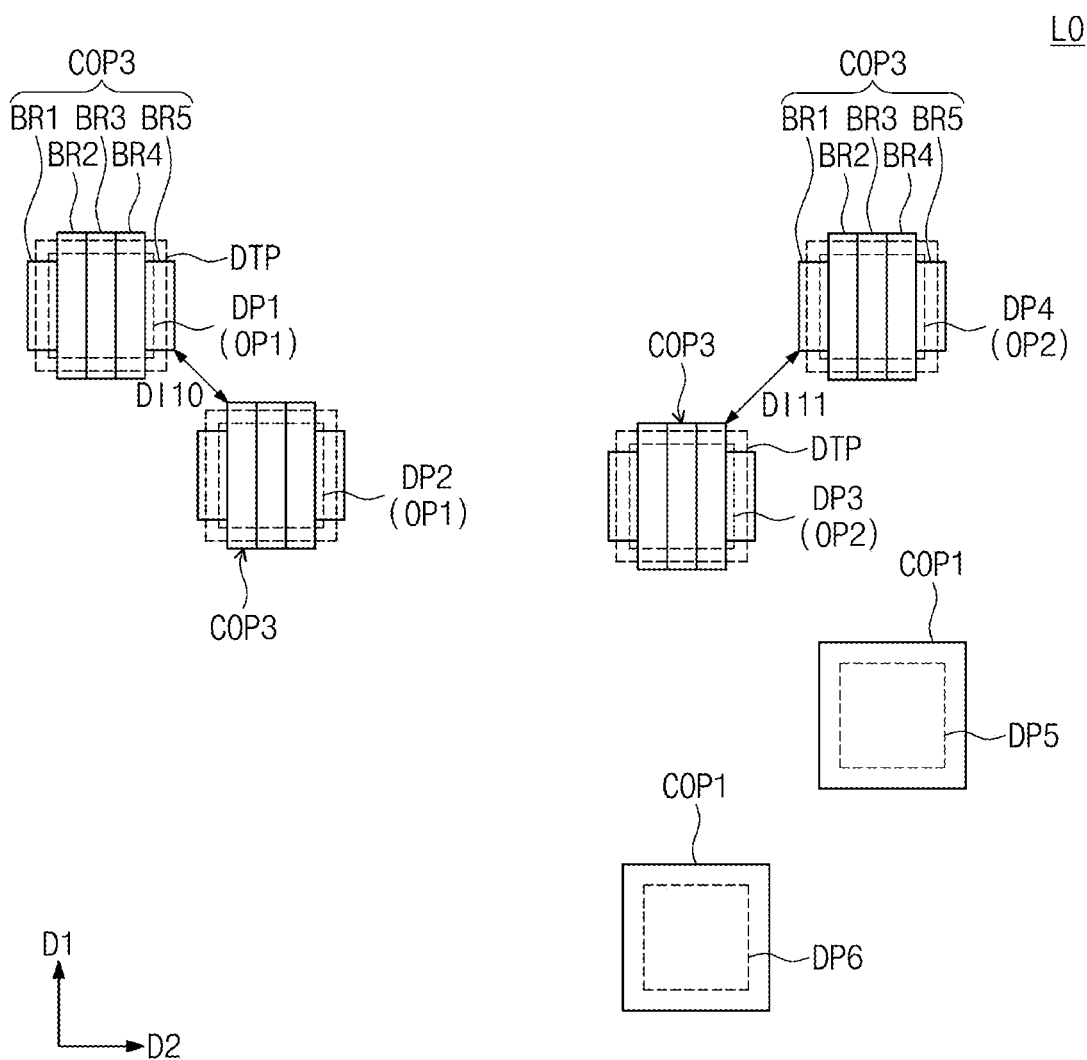

Referring to FIGS. 4 and 10, a third correction pattern COP3 may be generated by correcting the first to fifth blocks BR1-BR5 under the mask rule (in S37). In detail, each of the first to fifth blocks BR1-BR5 may be biased. The biased first to fifth blocks BR1-BR5 may constitute/correspond to the third correction pattern COP3. The first to fifth blocks BR1-BR5 may be biased such that the distance between adjacent ones of the third correction patterns COP3 is greater than or equal to the mask rule value.

For example, each of the first and fifth blocks BR1 and BR5 of the first design pattern DP1 may be biased to have a reduced size (e.g. a reduced width and/or length). Each of the first and fifth blocks BR1 and BR5 of the second design pattern DP2 may be biased to have a reduced size (e.g. a reduced width and/or length). Thus, the shortest distance between nearest corners of the third correction pattern COP3 of the first design pattern DP1 and the third correction pattern COP3 of the second design pattern DP2 may become a tenth distance DI10. The tenth distance DI10 may be larger than the mask rule value.

Similarly, to allow an eleventh distance DI11 between the third correction pattern COP3 of the third design pattern DP3 and the third correction pattern COP3 of the fourth design pattern DP4 to be greater than or equal to the mask rule value, each of the first to fifth blocks BR1-BR5 thereof may be biased.

In some example embodiment, the biasing of the blocks may be independent. For example, the blocks may be biased to have different shapes and/or sizes from each other.

Figure 11:
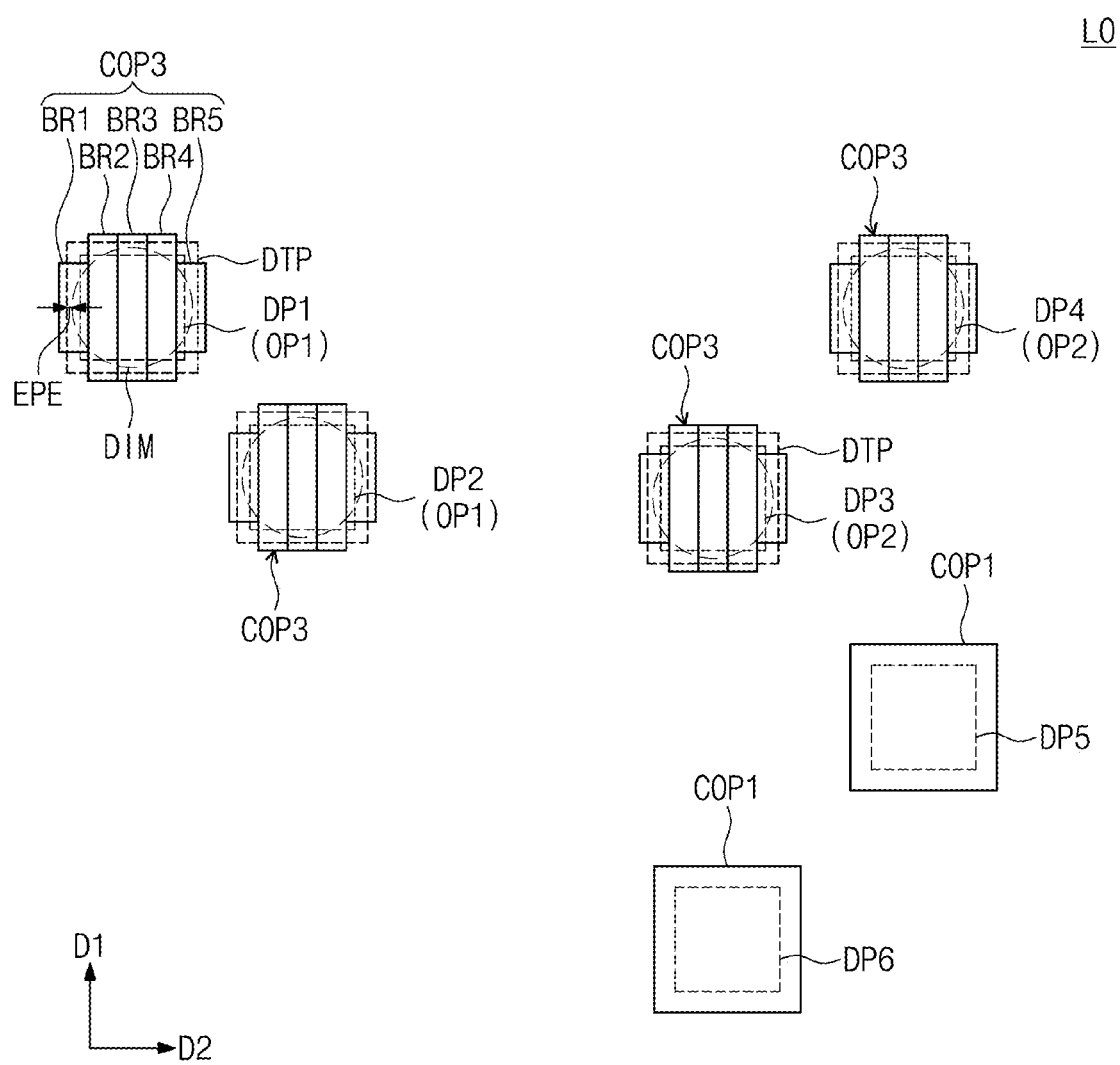

Referring to FIGS. 4 and 11, a target error of each of the third correction patterns COP3 may be measured (in S38). In detail, the develop image DIM for the third correction pattern COP3 may be generated through a simulation process based on the OPC model. The target error EPE between the develop image DIM and the develop target DTP may be measured.

For example, in the case of the first design pattern DP1, the target error EPE between the develop image DIM and the develop target DTP may occur. The measured target error EPE may be greater than a specific value required/used in the OPC operation. In the case where the target error EPE is greater than the specific value, the afore-described step of correcting the blocks (in S37) may be performed again for the third correction pattern COP3 with the target error EPE.

Figure 12:
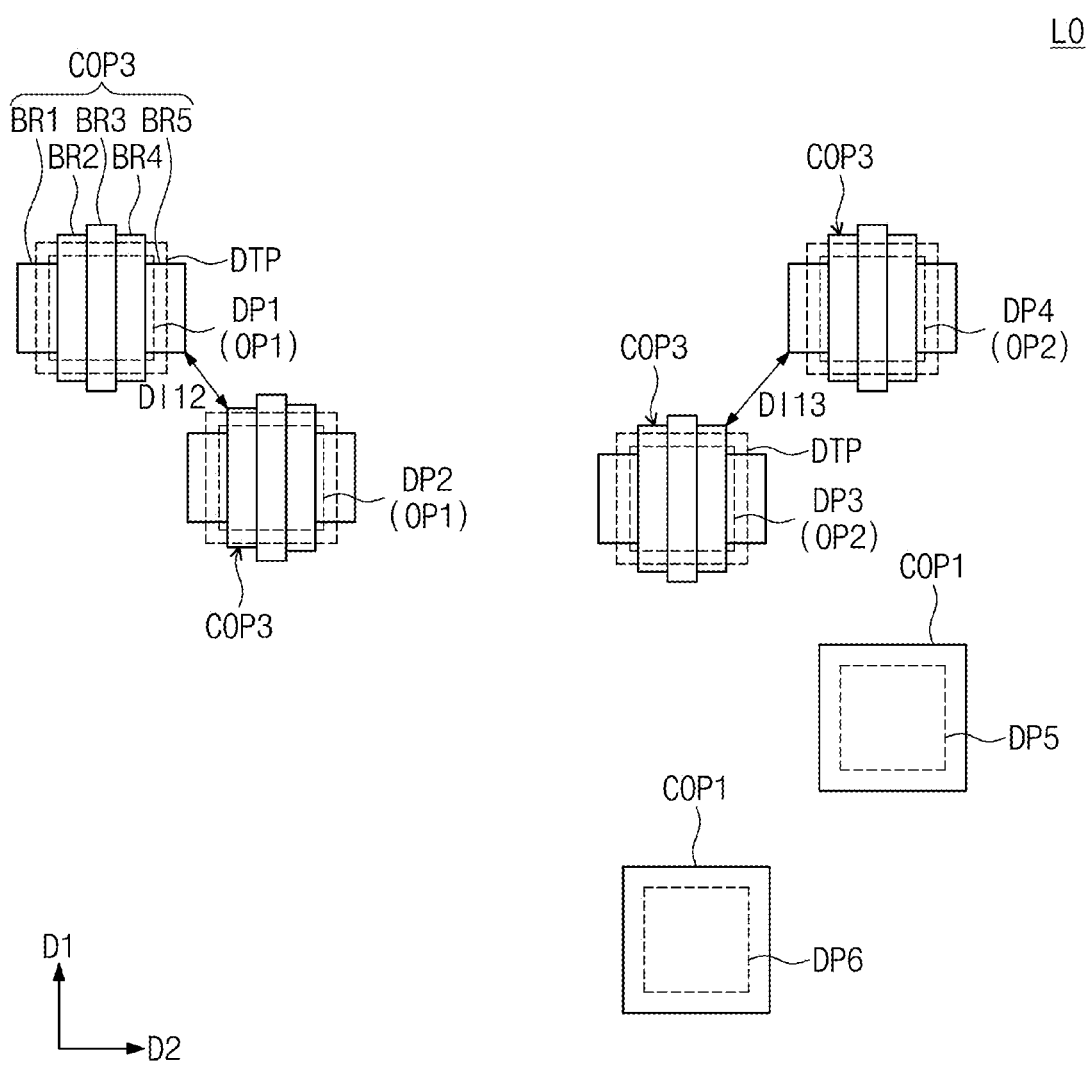

Referring to FIGS. 4 and 12, for the third correction patterns COP3 with the target error EPE, the first to fifth blocks BR1-BR5 may be re-corrected (in S39). The mask rule may be applied when the first to fifth blocks BR1-BR5 are re-corrected.

For example, each of the first and fifth blocks BR1 and BR5 of the first design pattern DP1 may be biased. Each of the first and fifth blocks BR1 and BR5 may be biased to have a reduced width in a first direction D1 and an increased width in a second direction D2. The third block BR3 may be biased to have an increased width in the first direction D1.

Alternatively or additionally, the first to fifth blocks BR1-BR5 of each of the second, third, and fourth design patterns DP2, DP3, and DP4 may also be biased. The biasing of the blocks may be performed such that they have different shapes and/or sizes from each other.

As a result of the re-correction of the first to fifth blocks BR1-BR5, the third correction patterns COP3 may be corrected. A twelfth distance DI12 between the third correction pattern COP3 of the first design pattern DP1 and the third correction pattern COP3 of the second design pattern DP2 may be larger than the mask rule value. A thirteenth distance DI13 between the third correction pattern COP3 of the third design pattern DP3 and the third correction pattern COP3 of the fourth design pattern DP4 may be greater than the mask rule value.

Figure 13:
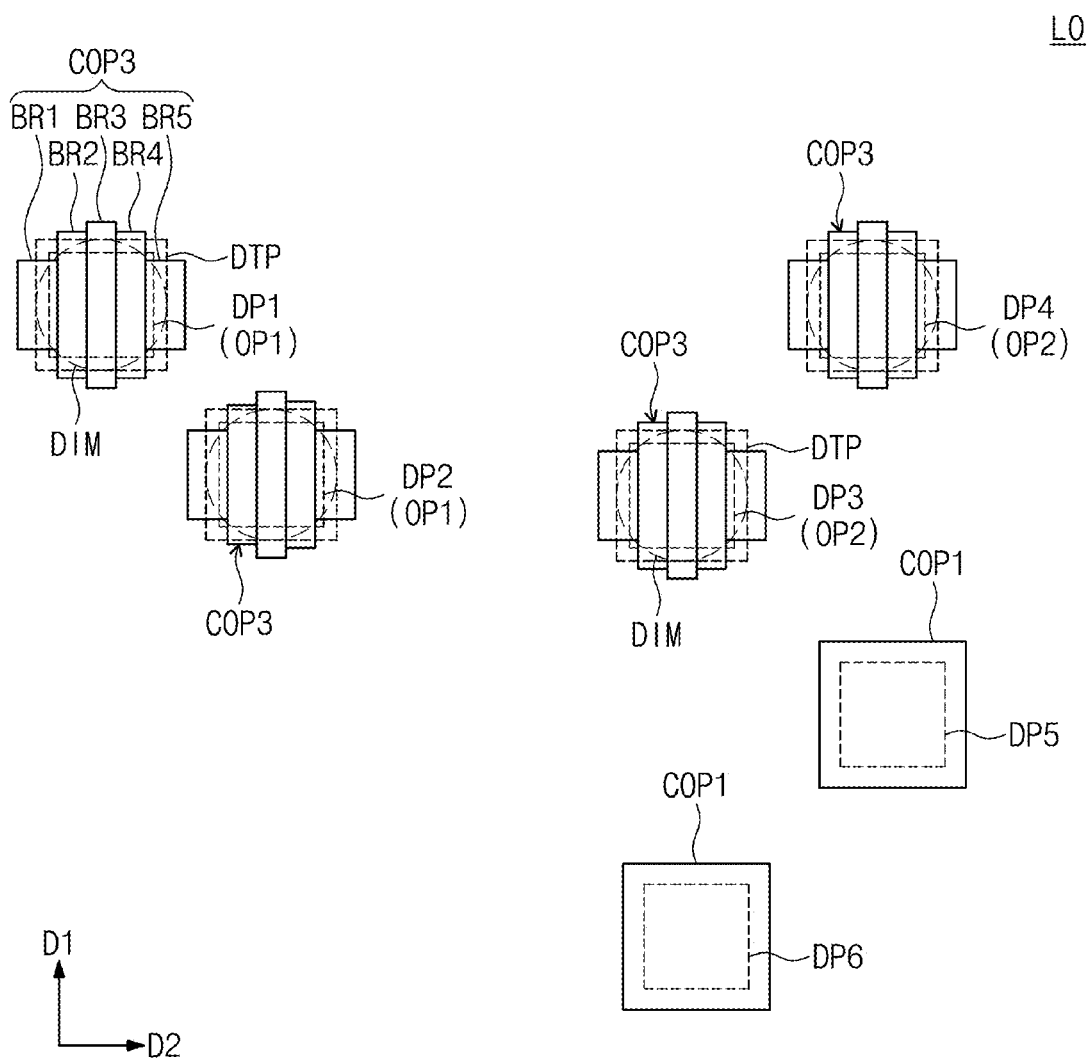

Referring now to FIG. 13, a target error for each of the biased third correction patterns COP3 may be re-measured. For example, in the case of the first design pattern DP1, the target error EPE between the develop image DIM and the develop target DTP may be zero or may be smaller than the specific value. As a result, the third correction pattern COP3 of the first design pattern DP1 may be determined as the final OPC pattern.

Even in the case of each of the second, third, and fourth design patterns DP2, DP3, and DP4, the target error EPE may be zero or may be less than the specific value. In this case, the OPC operation for each of them may be terminated, and the third correction pattern COP3 of the present stage may be determined as the final OPC pattern.

If any one of the second, third, and fourth design patterns DP2, DP3, and DP4 has the target error EPE, e.g. has the target error EPE greater than some value, the step (in S39) of correcting the blocks may be repeated for such a design pattern.

Figure 14A:
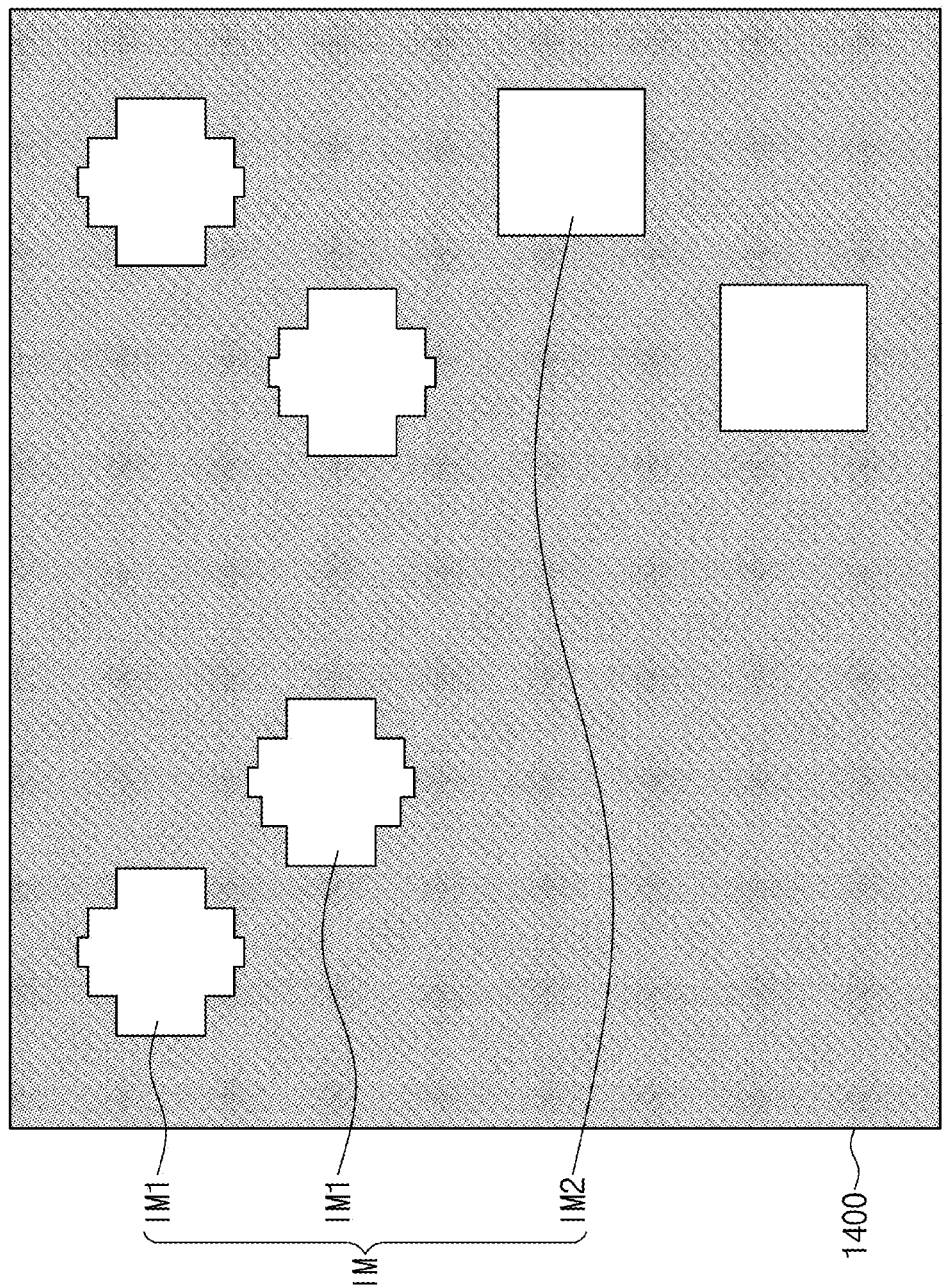
FIG. 14A is a plan view illustrating a photomask according to some example embodiments of inventive concepts.

FIG. 14A is a plan view illustrating a photomask according to some example embodiments of inventive concepts. Referring to FIGS. 2 and 14A, the photomask 1400 may be taped out, e.g. may be manufactured based on the final OPC patterns of FIG. 13 (in S40). The photomask 1400 may include image patterns IM. The image patterns IM may include first image patterns IM1, which are formed in accordance with the afore-described third correction patterns COP3 determined as the final OPC pattern. The image patterns IM may further include second image patterns IM2, which are formed in accordance with the afore-described first correction patterns COP1.

The photomask 1400 may include a transparent region and an opaque region. The opaque region may be configured to at least partially prevent and/or block the light from passing therethrough. By contrast, the transparent region may be configured to allow light, which is incident from the light source 1200 of FIG. 3, to pass therethrough. Light passing through the photomask 1400 may be irradiated onto the substrate SUB of FIG. 3. For example, when the photolithography process is performed using a negative-type photoresist, the image patterns IM may be the transparent region of the photomask 1400. The photoresist may be or include an organic material such as a polymer that reacts to, e.g. cross-links in the presence of, light, e.g. light of a specific wavelength.

Figure 14B:
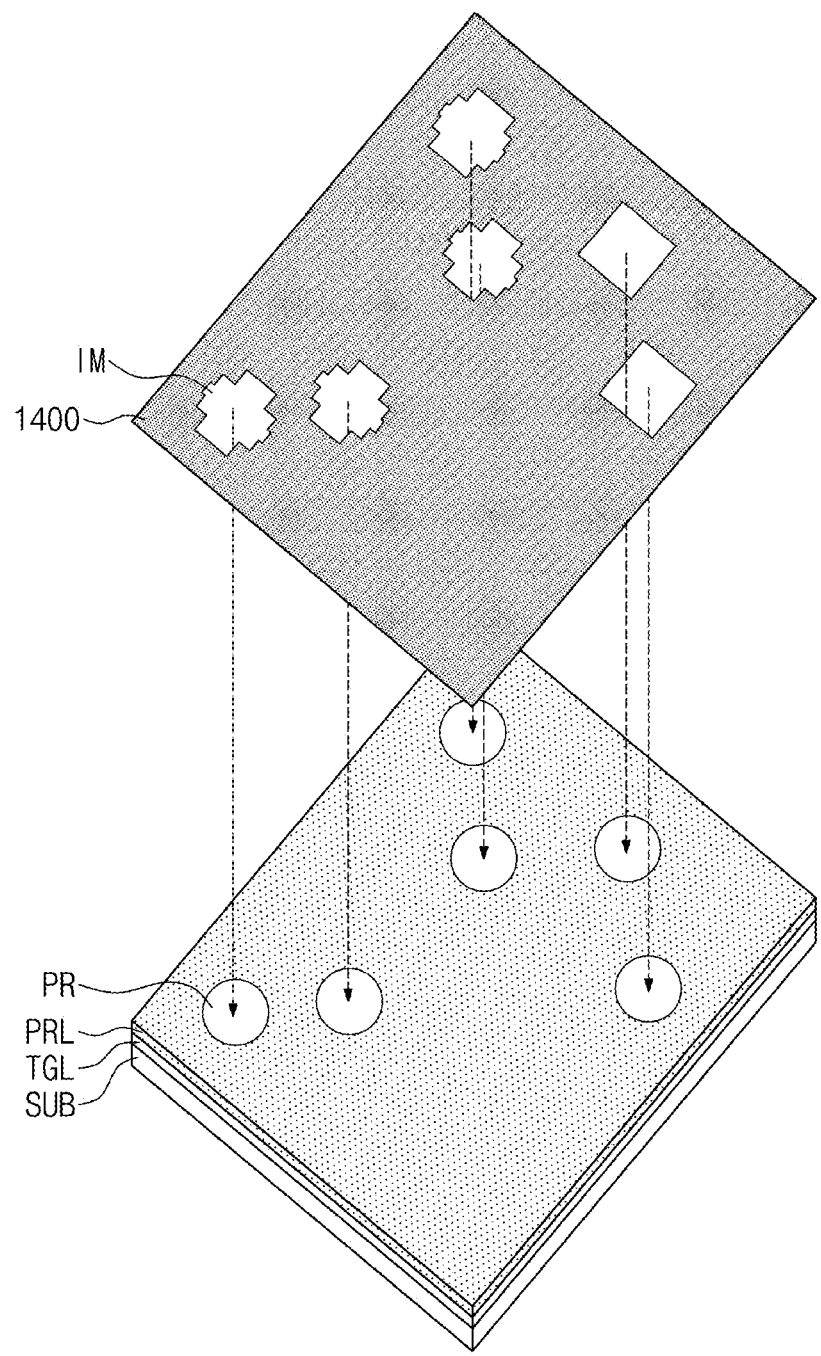
FIG. 14B is a conceptual diagram illustrating a process of forming photoresist patterns on a substrate using the photomask of FIG. 14A.

FIG. 14B is a conceptual diagram illustrating a process of forming photoresist patterns on a substrate using the photomask of FIG. 14A. Referring to FIG. 14B, the light source 1200 of FIG. 3 may be configured to emit light toward the photomask 1400. The emitted light may pass through the transparent region of the image patterns IM and may be irradiated onto a photoresist layer PRL on the substrate SUB (e.g., through an exposure process). Although not illustrated, there may be layers under photoresist layer PRL, such as an anti-reflective coating (ARC) layer; however, example embodiments are not limited thereto. A region of the photoresist layer PRL, onto which the light is irradiated, may become a photoresist pattern PRP. For example, the photoresist pattern PRP may be formed by cross-linking of the photoresist layer PRL. The photoresist pattern PRP may be formed to have the same shape and size as those of the develop image DIM described above.

If a developing process is performed, the photoresist patterns PRP may be left and all regions of the photoresist layer PRL other than the photoresist patterns PRP may be removed. An etching target layer TGL on the substrate SUB may be patterned using the photoresist patterns PRP as an etch mask. The etching target layer TGL may be or correspond to a hardmask layer, and may be or include an oxide and/or a nitride; however, example embodiments are not limited thereto. For example, the etching target layer TGL may be or include a metal layer and/or a silicon layer such as a polysilicon layer. Thus, target patterns of desire shapes may be formed on the substrate SUB. As a result, a semiconductor device may be fabricated by forming target patterns in each layer using this method (in S50 of FIG. 2). Alternatively or additionally, there may not be an etching target layer TGL, and the photoresist patterns PRP may be used as an implant mask to block implantation of impurities.

In the OPC method according to some example embodiments of inventive concepts, at least one of the OPC operation may be performed without restriction of a mask rule, and then, the correction pattern may be divided into blocks. Thus, the OPC method may have a technical advantage in that the OPC method is relatively free from the mask rule. In the OPC method, the OPC operation may be selectively and/or more precisely performed on only chosen object patterns. An additional OPC operation may be selectively applied to only patterns, for which an additional correction is required, and thus, it may be possible to reduce an operation time and/or to realize an efficient process. Alternatively or additionally, it may be possible to minimize or reduce the impact of a side effect, which may occur in patterns that are not chosen as the object patterns.

Figure 15:
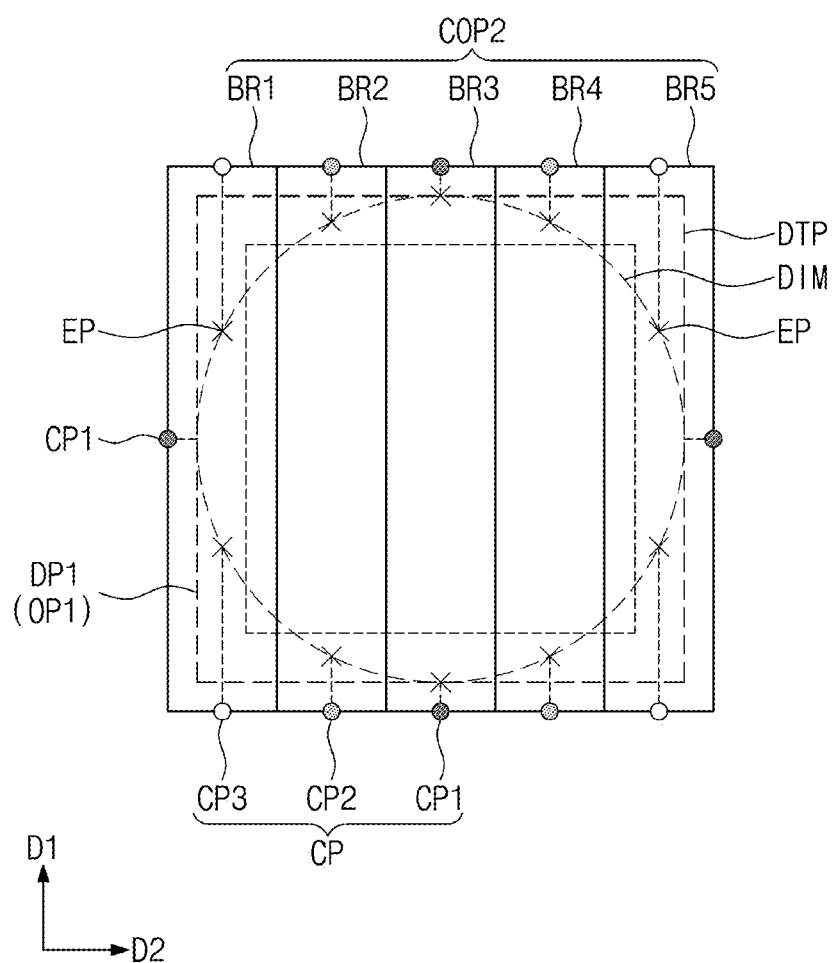
FIGS. 15 and 16 are layout diagrams illustrating an optical proximity correction process according to some example embodiments of inventive concepts.
Figure 16:
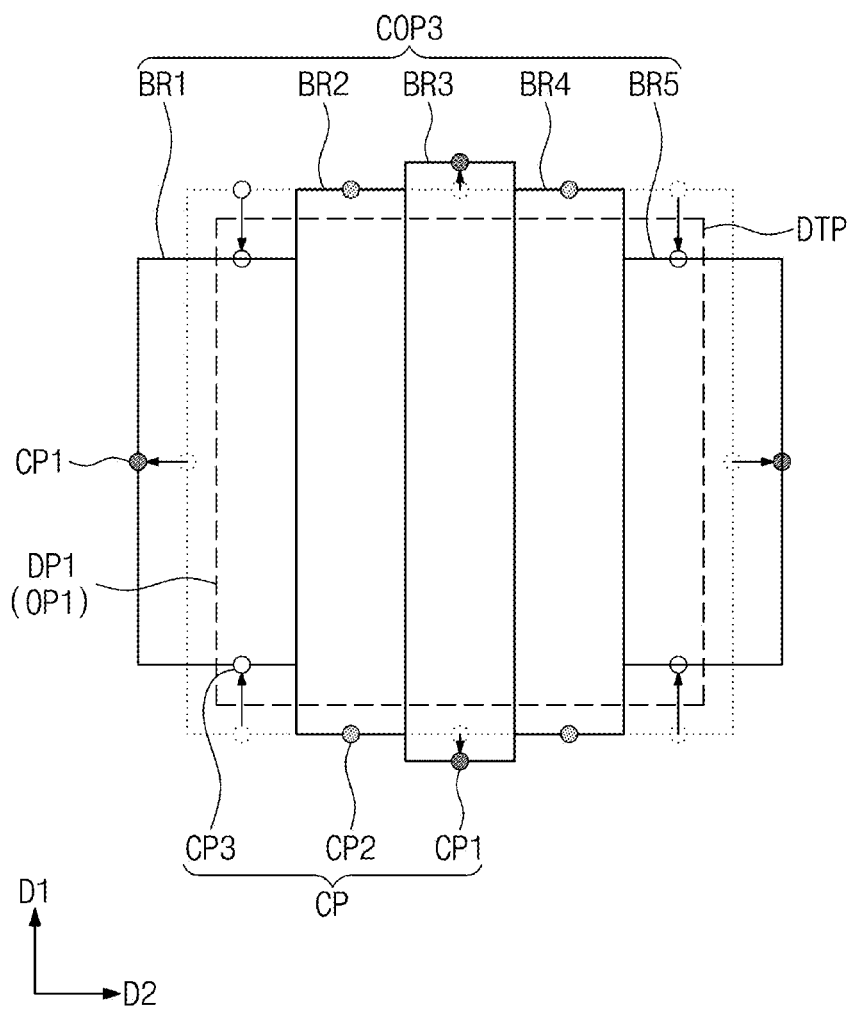

FIGS. 15 and 16 are layout diagrams illustrating an optical proximity correction process according to some example embodiments of inventive concepts. Referring to FIG. 15, the first design pattern DP1 of FIG. 9 and the second correction pattern COP2 thereof are exemplarily illustrated.

Control points CP may be defined for each of the first to fifth blocks BR1-BR5 of the second correction pattern COP2. The control point CP may be defined as a center of an outer edge of the block.

Evaluation points EP may be defined in the develop image DIM of the second correction pattern COP2. The evaluation point EP may be a point, which is located on an outer circumference or perimeter of the develop image DIM and has the same coordinate as that of the control point CP in the first or second direction D1 or D2. The evaluation points EP may be defined to correspond to the control points CP, respectively.

A weight may be assigned to the control point CP by measuring a distance between the control point CP and the evaluation point EP corresponding thereto. For example, in the case where a distance between the control point CP and the evaluation point EP is relatively small, the control point CP may be defined as a first control point CP1. The first control point CP1 may be assigned with a relatively high weight.

In a case where a distance between the control point CP and the evaluation point EP is relatively large, the control point CP may be defined as a third control point CP3. The third control point CP3 may be assigned with a relatively low weight.

In a case where a distance between the control point CP and the evaluation point EP is intermediate, the control point CP may be defined as a second control point CP2. The second control point CP2 may be assigned with a weight between those of the first and third control points CP1 and CP3.

Referring to FIG. 16, the third correction pattern COP3 may be generated by correcting the first to fifth blocks BR1-BR5 (e.g., in S37 of FIG. 4). The correction of each of the first to fifth blocks BR1-BR5 may be performed by biasing the control points CP. For example, the first block BR1 may be corrected in such a way that the third control points CP3 of the first block BR1 is biased in a direction parallel to the first direction D1 and the first control point CP1 is biased in a direction parallel to the second direction D2.

According to some example embodiments, the control points CP on the first to fifth blocks BR1-BR5 may be assigned with different weights from each other, and the extent of the biasing may be determined based on the weights, when the first to fifth blocks BR1-BR5 are corrected. By using the control points CP, it may be possible to take a rounded shape of the develop image DIM into consideration and thereby to perform the OPC operation in a more precise manner.

Figure 17:
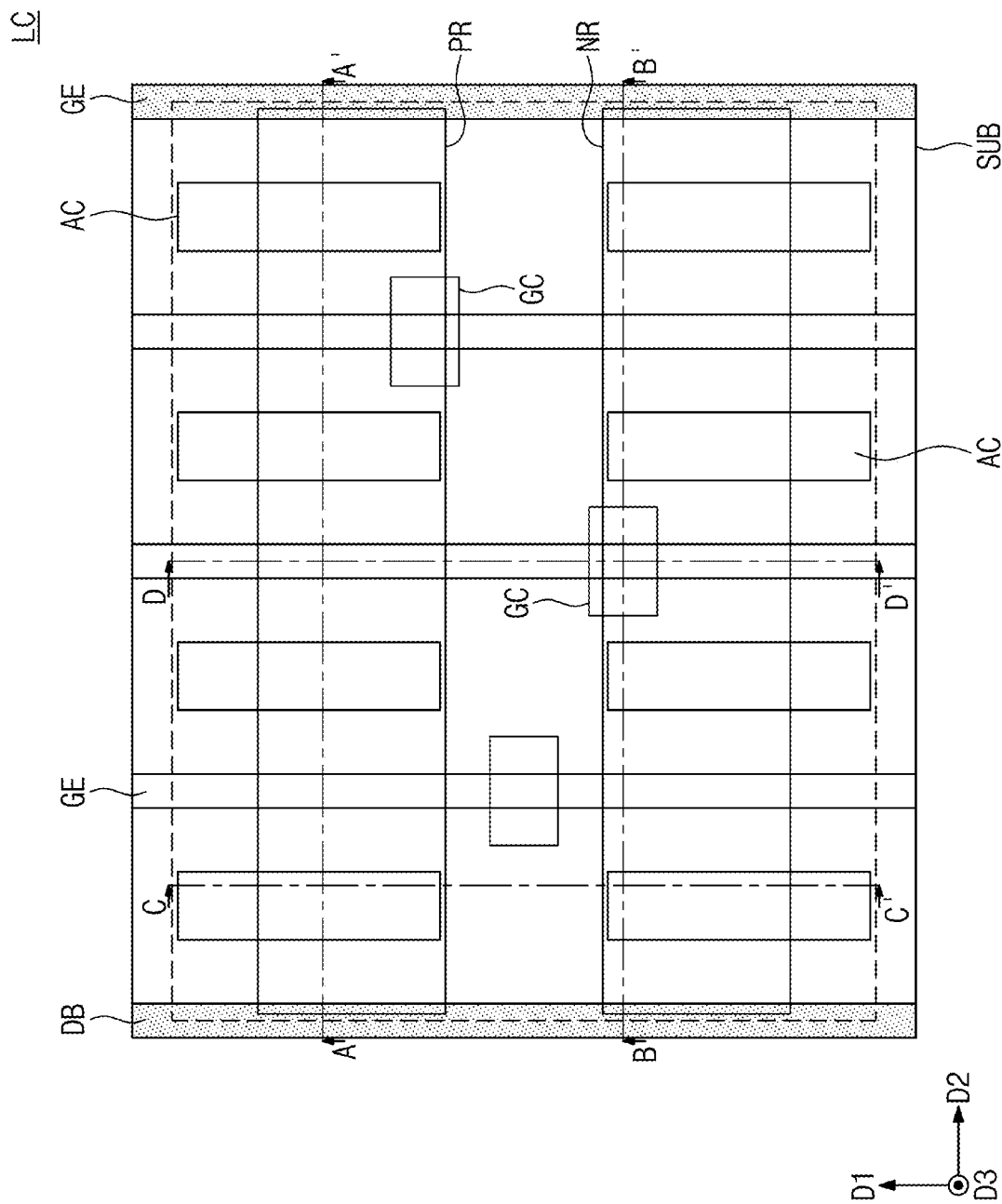
FIGS. 17, 19, and 22 are plan views illustrating a method of fabricating a semiconductor device, according to some example embodiments of inventive concepts.
Figure 18A:
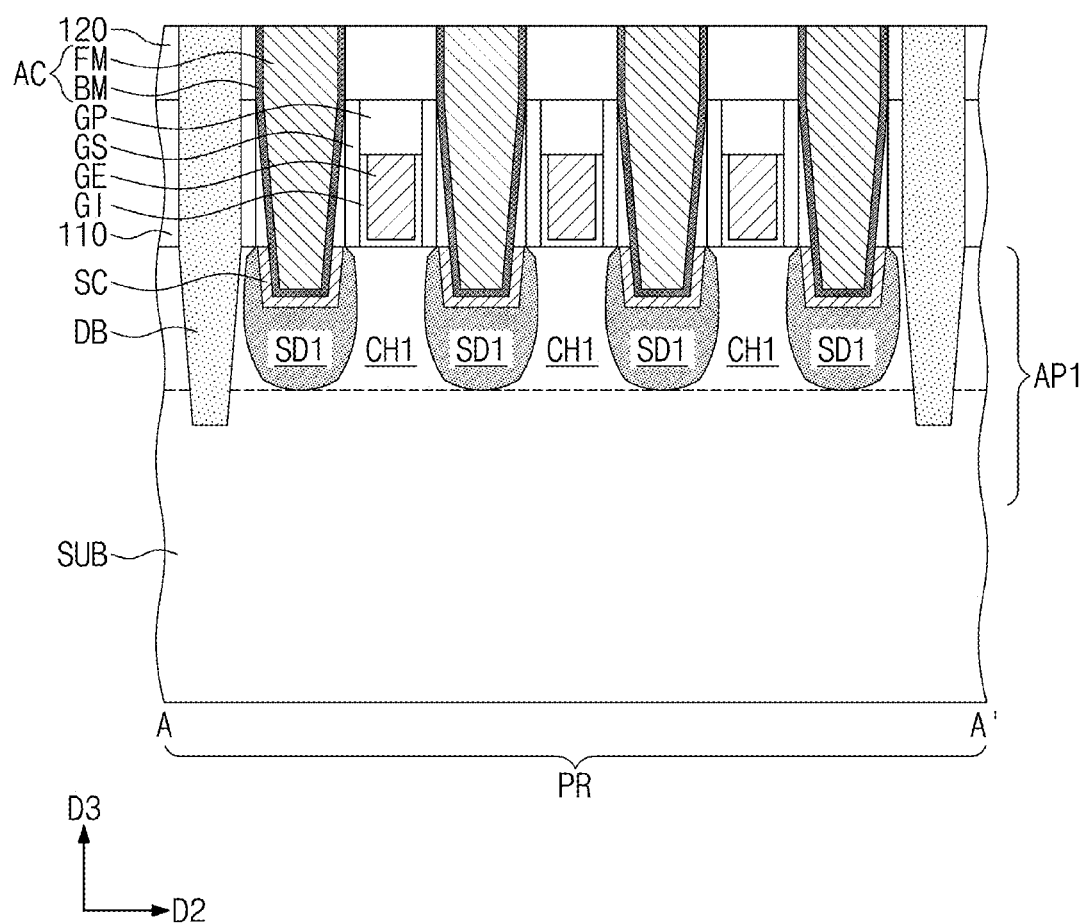
FIGS. 18A, 20A, and 23A are sectional views taken along lines A-A' of FIGS. 17, 19, and 22, respectively.
Figure 18B:
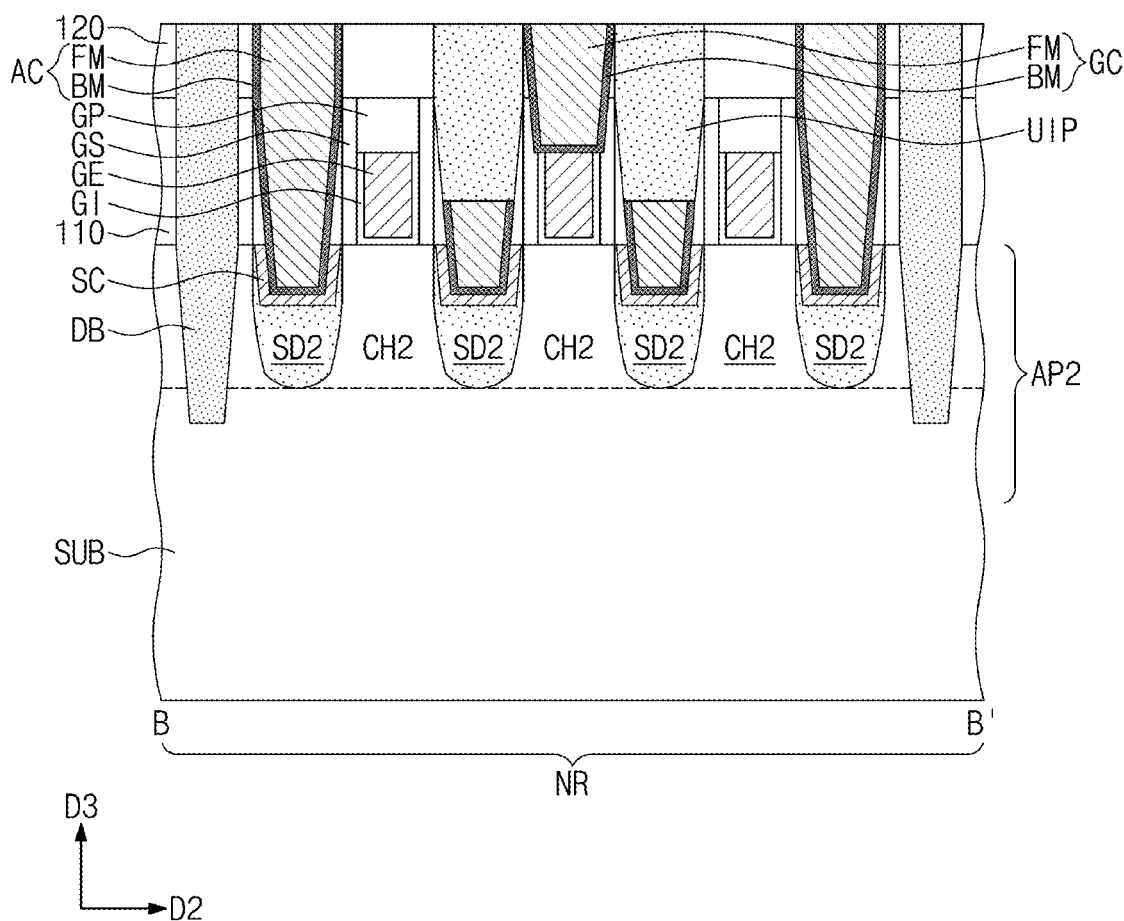
FIGS. 18B, 20B, and 23B are sectional views taken along lines B-B' of FIGS. 17, 19, and 22, respectively.
Figure 18C:
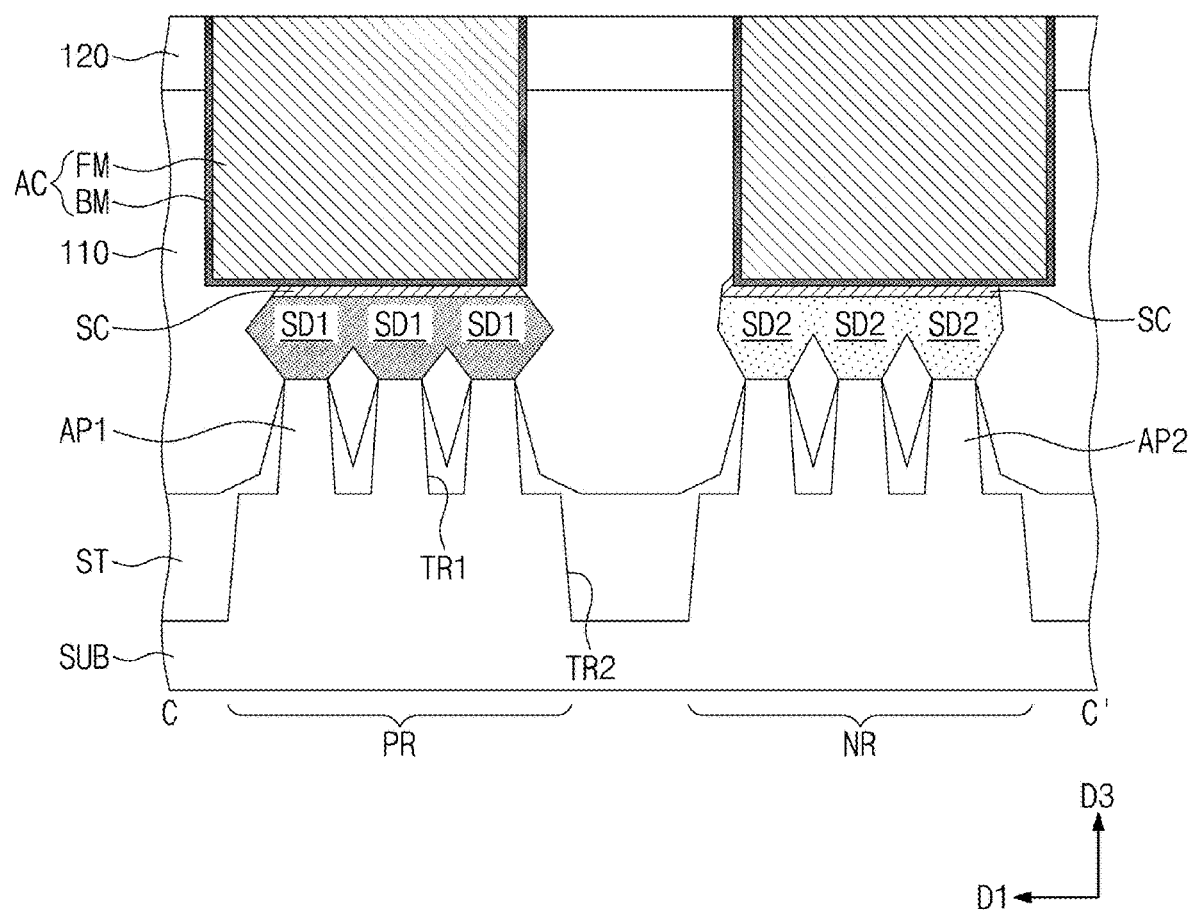
FIGS. 18C, 20C, and 23C are sectional views taken along lines C-C' of FIGS. 17, 19, and 22, respectively.
Figure 18D:
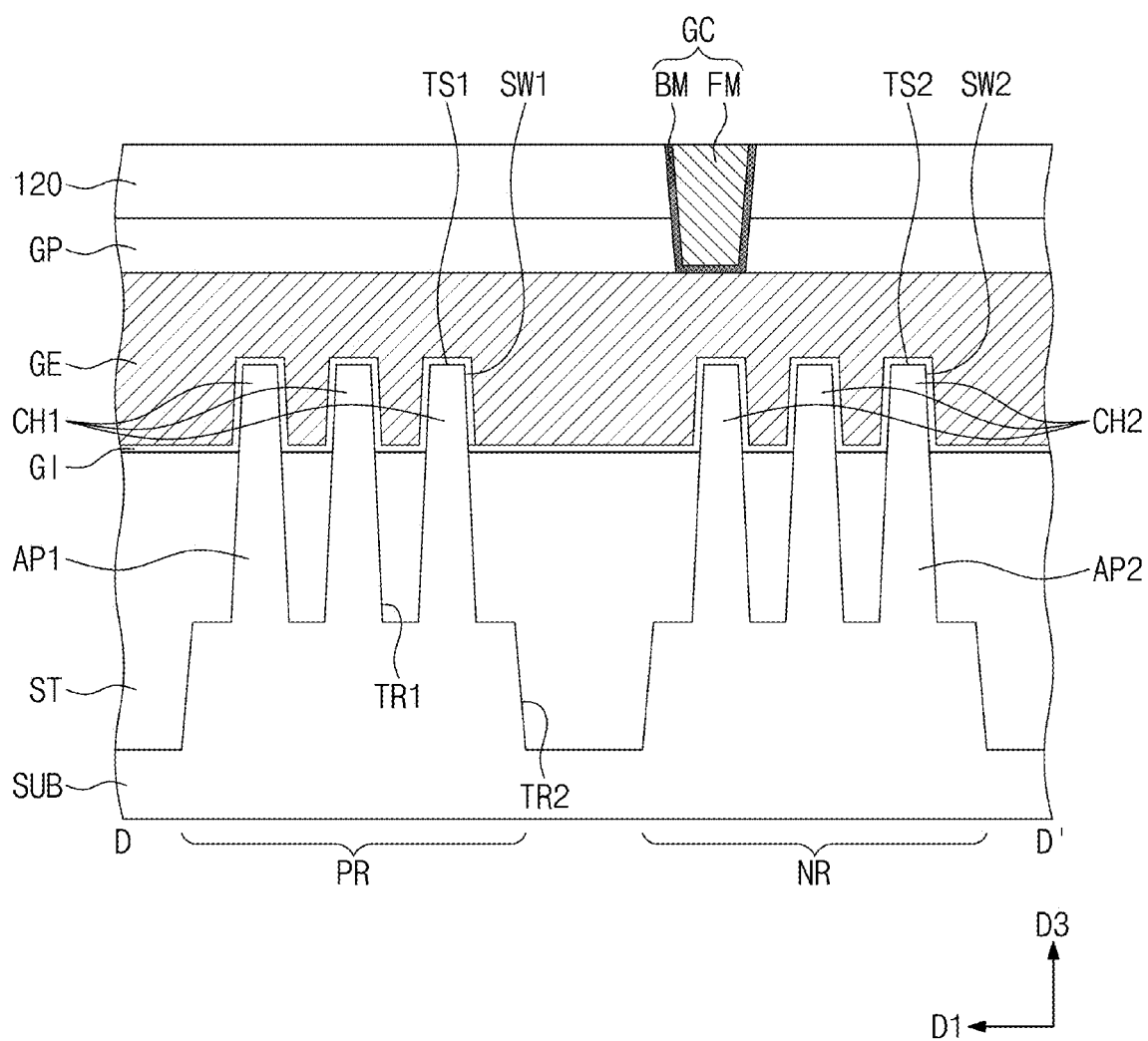
FIGS. 18D, 20D, and 23D are sectional views taken along lines D-D' of FIGS. 17, 19, and 22, respectively.
Figure 19:
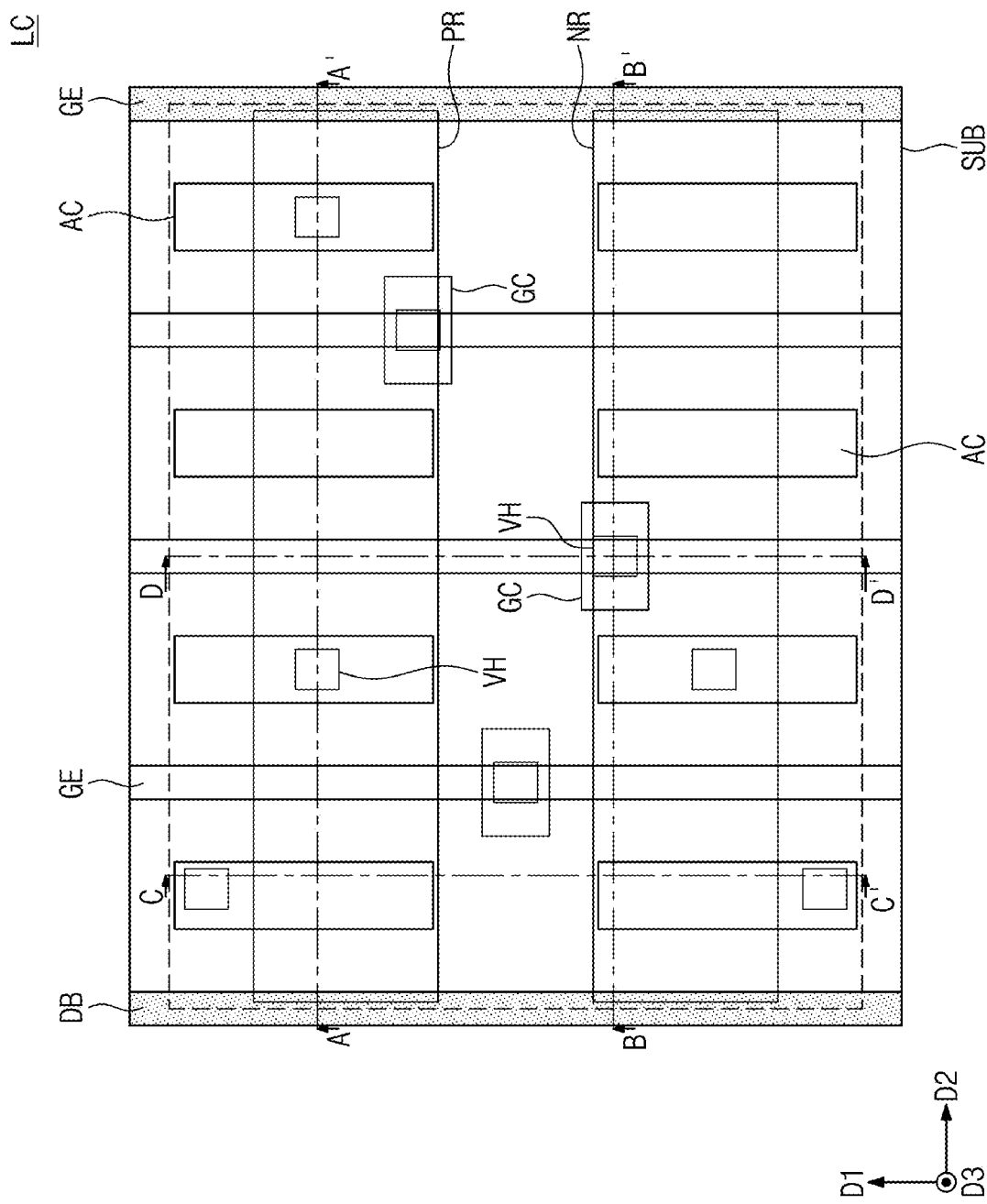
Figure 20A:
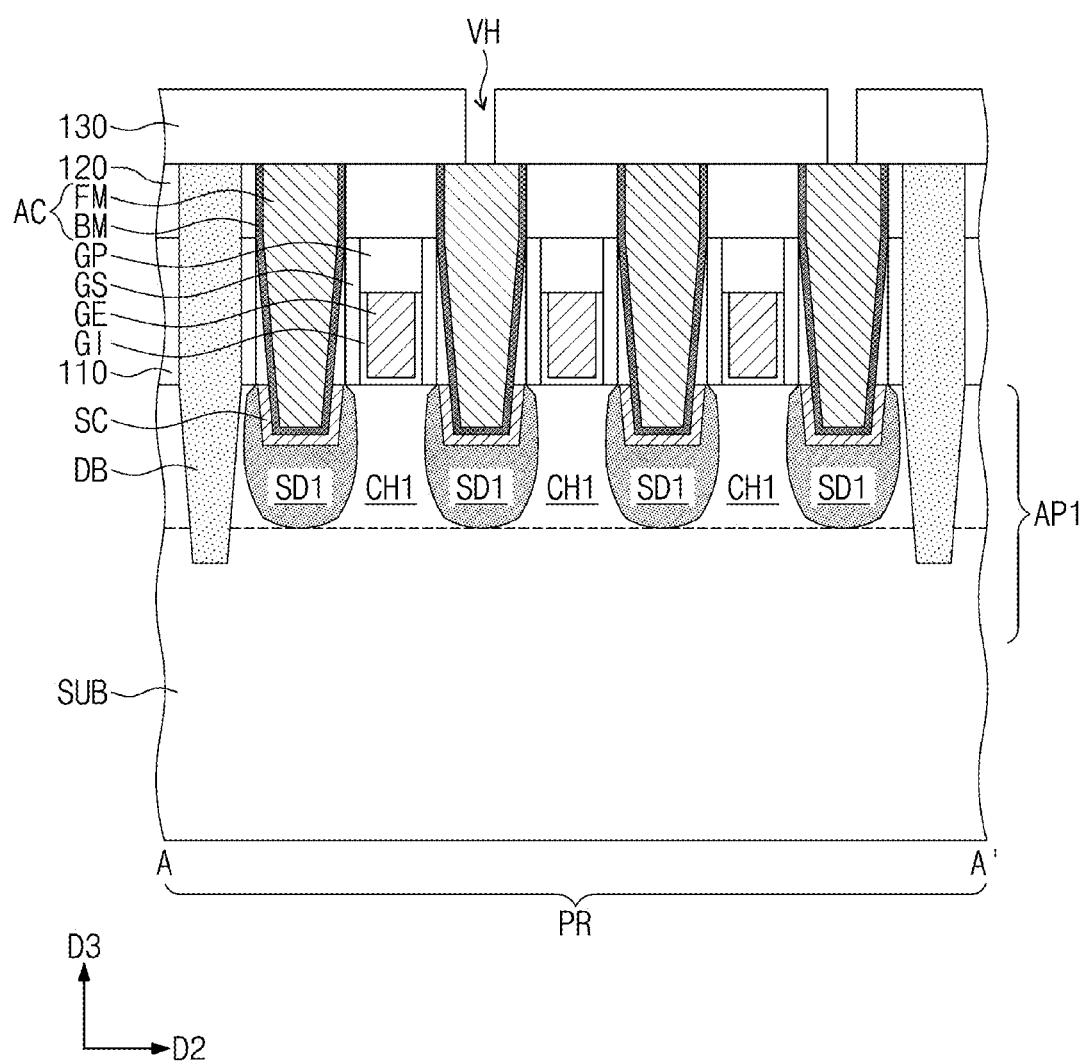
Figure 20B:
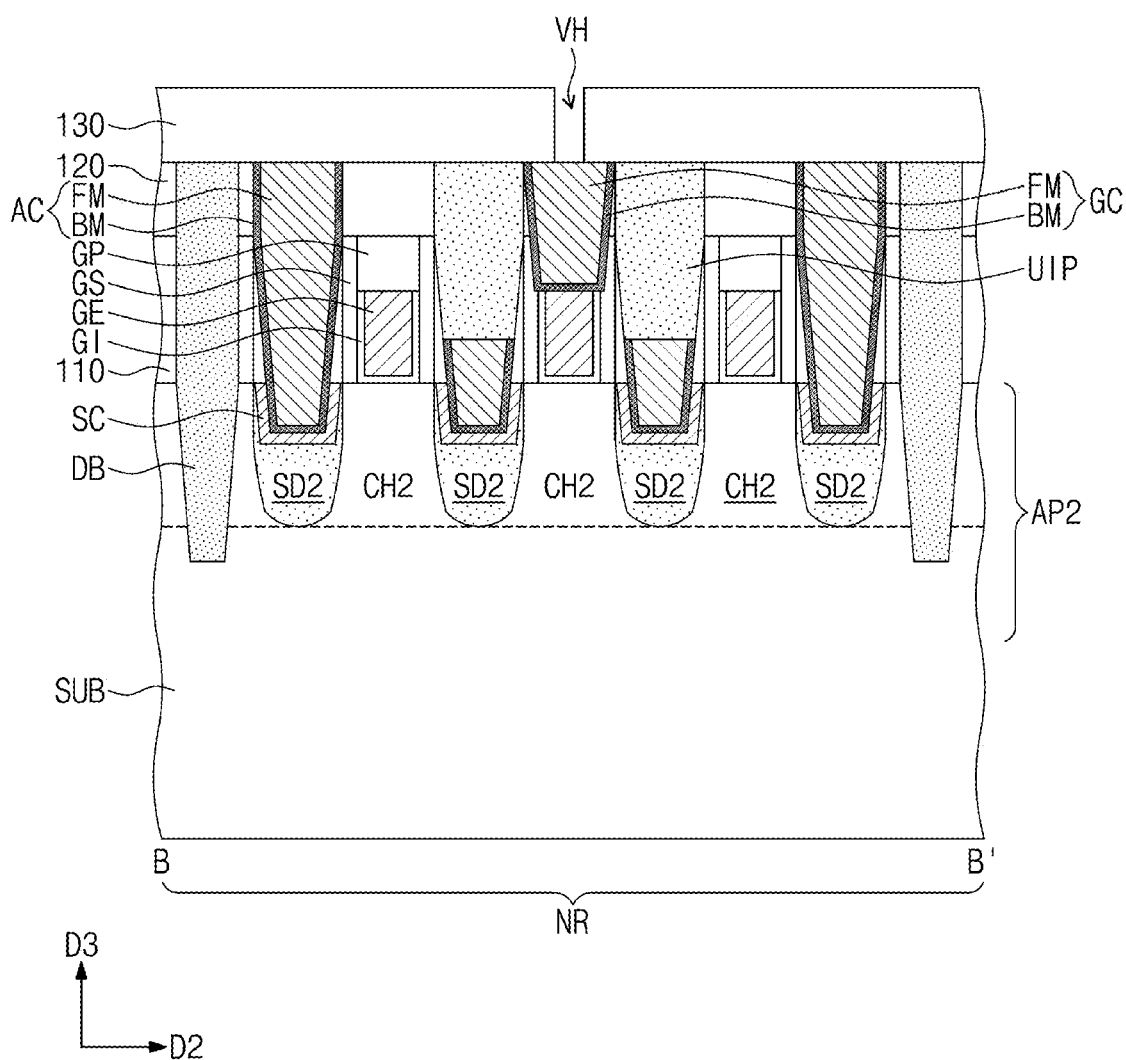
Figure 20C:
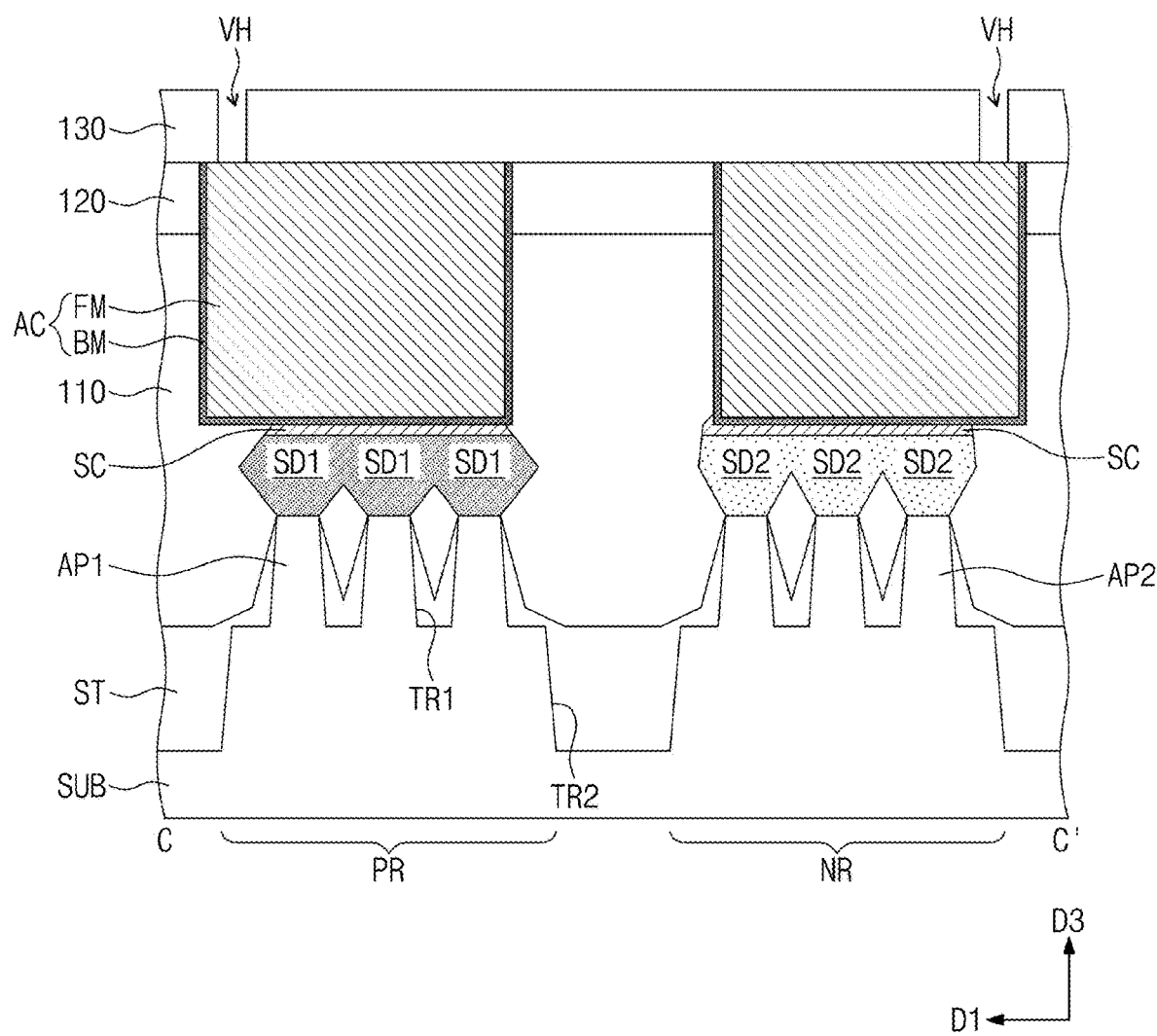
Figure 20D:
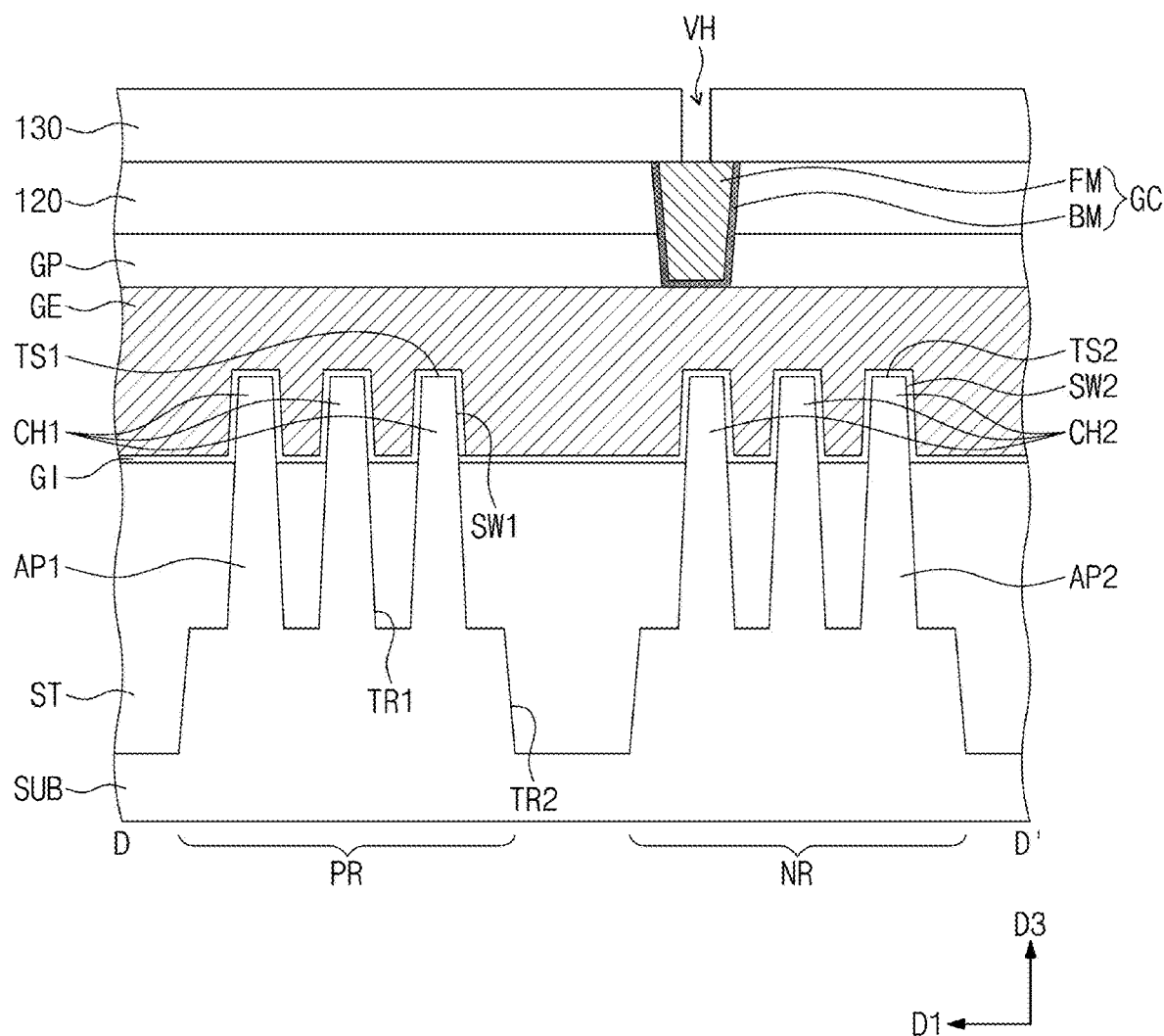
Figure 21:
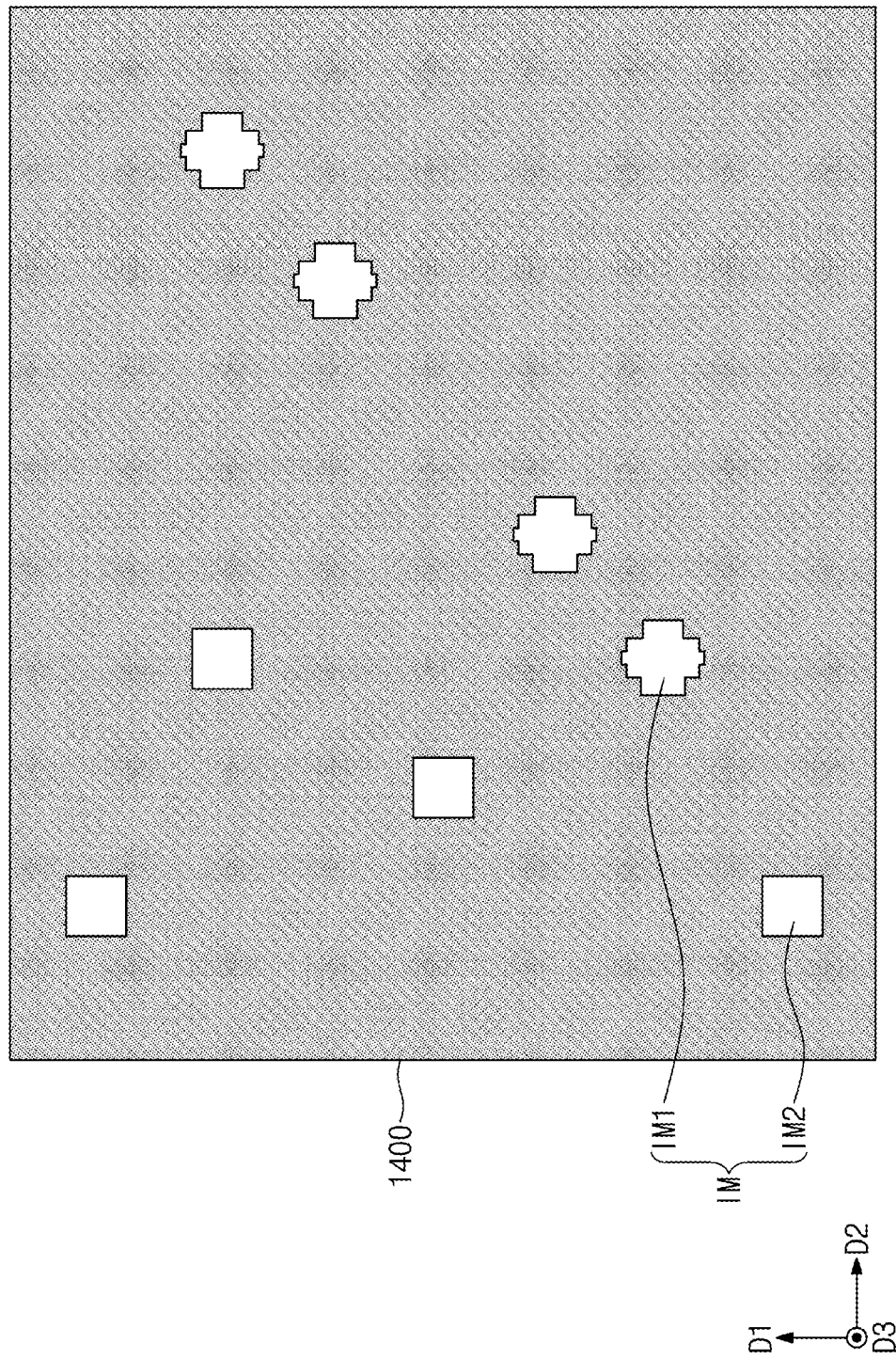
FIG. 21 is a plan view illustrating a photomask, which is used to form via holes, according to some example embodiments of inventive concepts.
Figure 22:
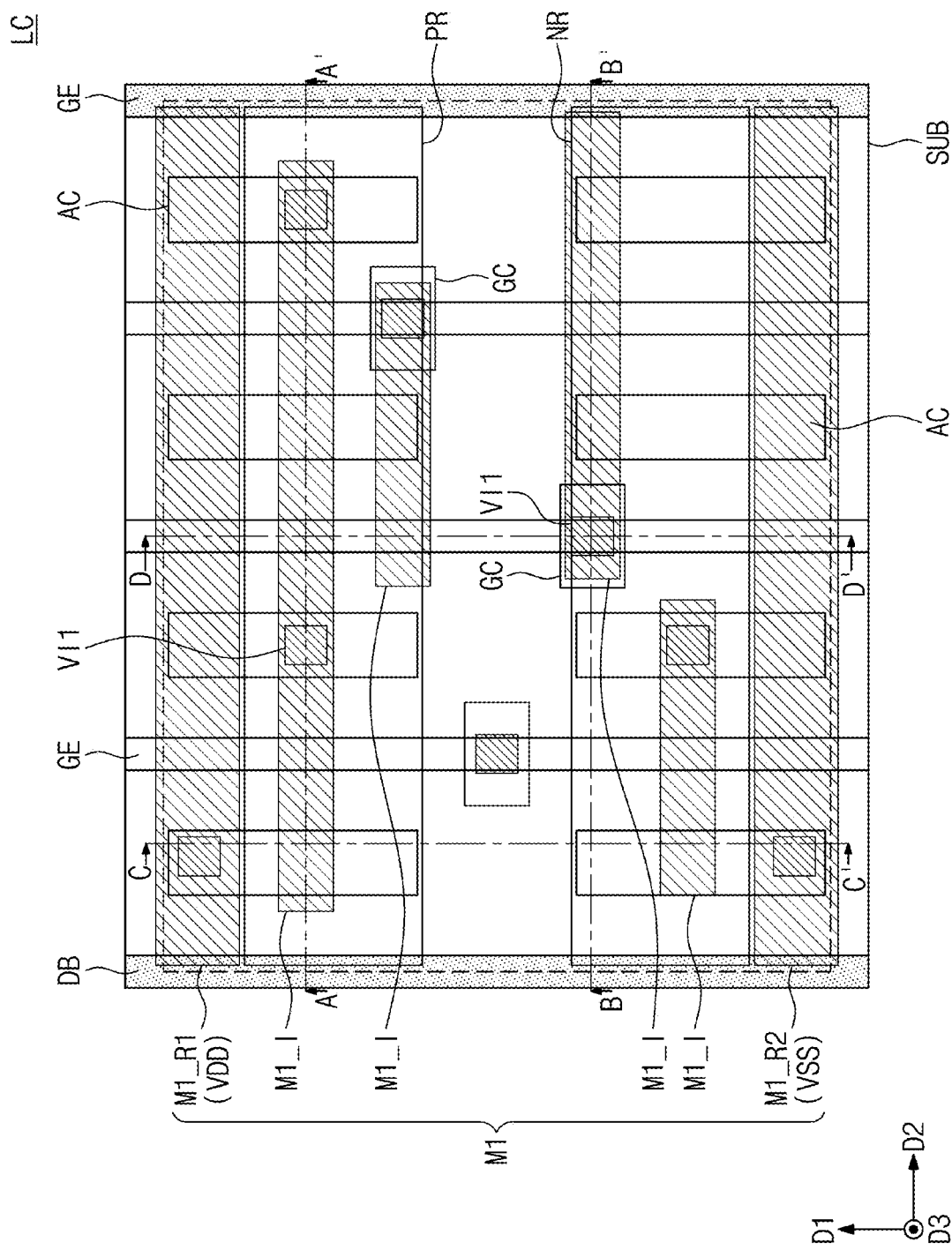
Figure 23A:
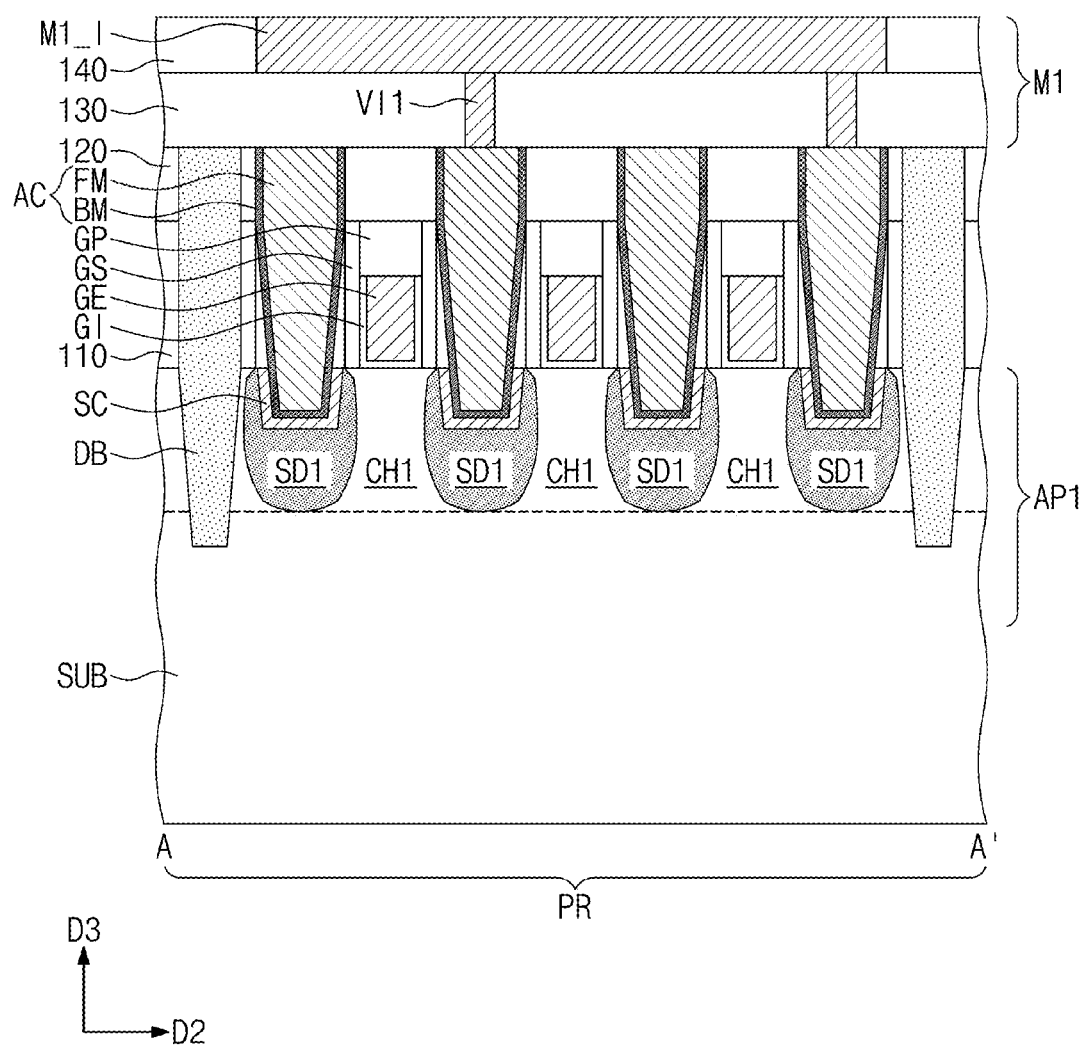
Figure 23B:
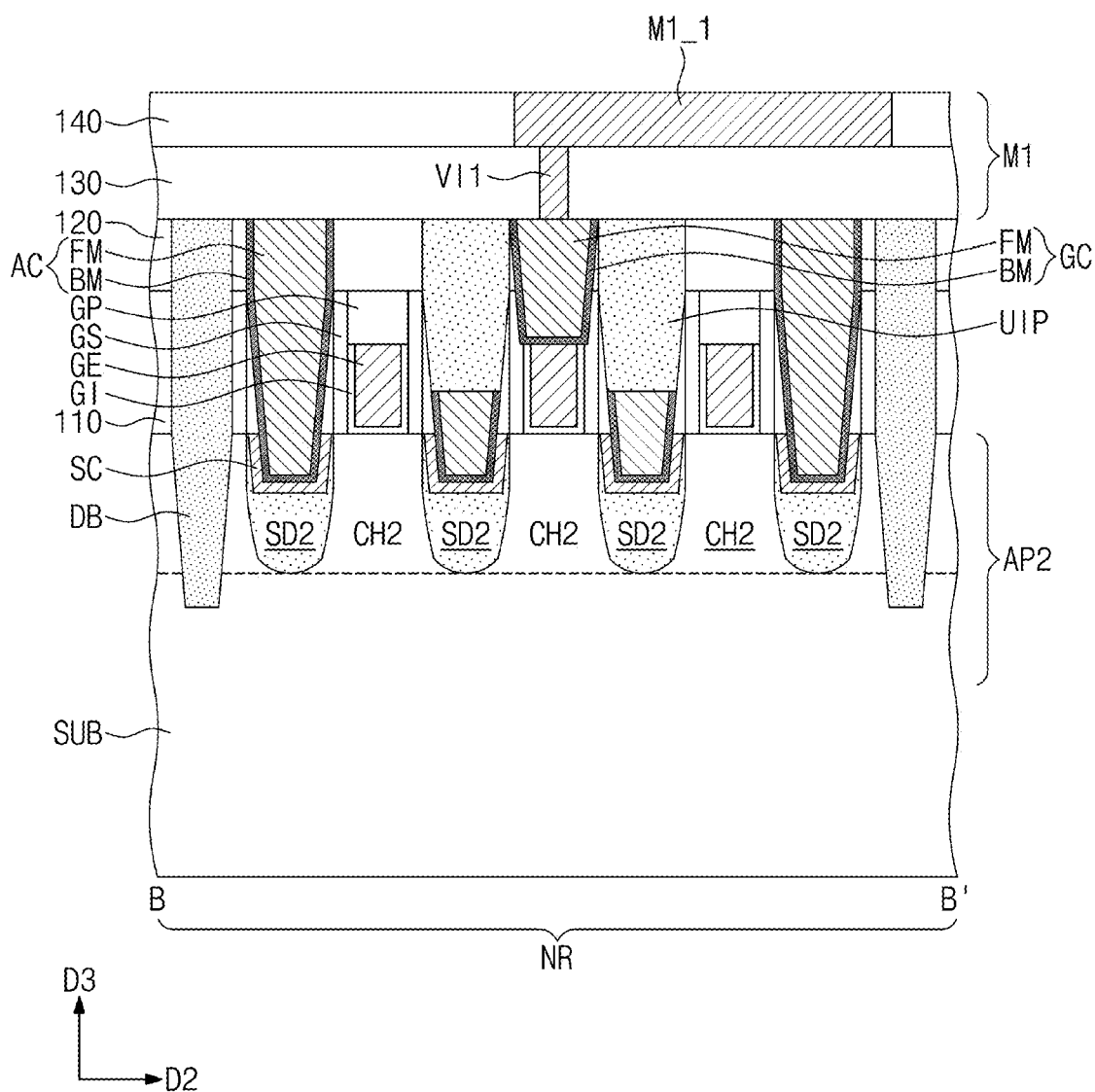
Figure 23C:
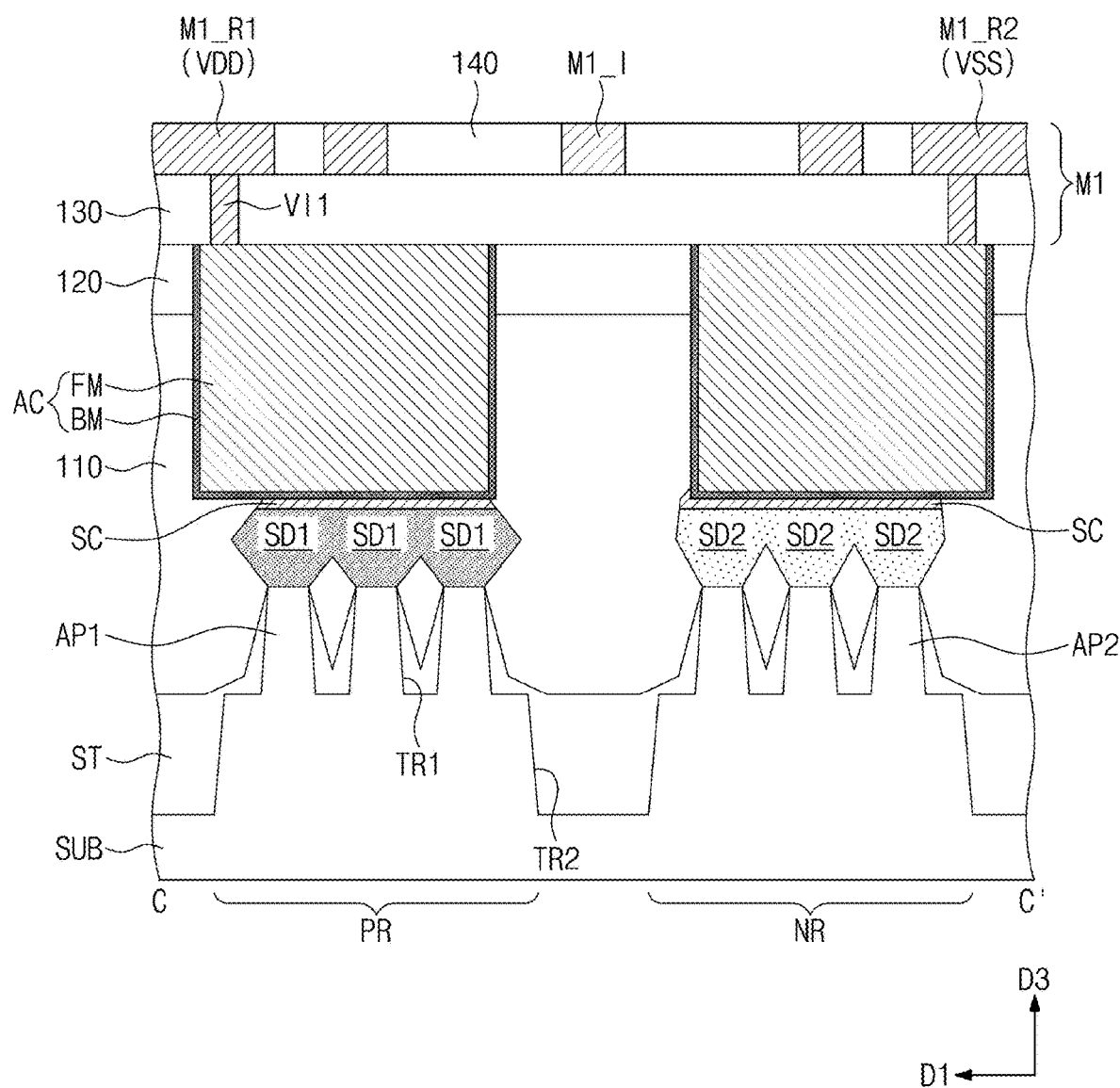
Figure 23D:
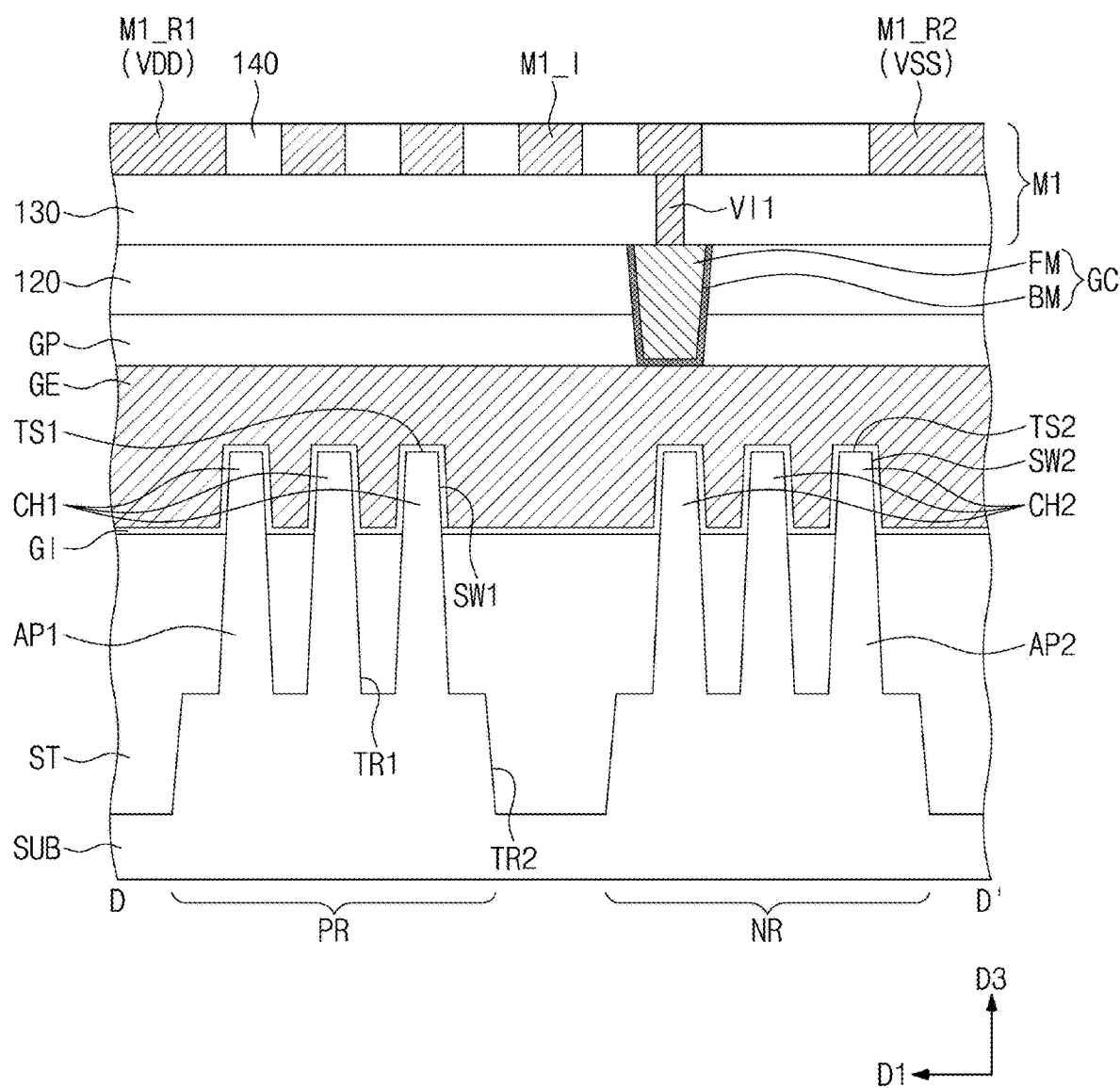

FIGS. 17, 19, and 22 are plan views illustrating a method of fabricating a semiconductor device, according to some example embodiments of inventive concepts. FIGS. 18A, 20A, and 23A are sectional views taken along lines A-A' of FIGS. 17, 19, and 22, respectively. FIGS. 18B, 20B, and 23B are sectional views taken along lines B-B' of FIGS. 17, 19, and 22, respectively. FIGS. 18C, 20C, and 23C are sectional views taken along lines C-C' of FIGS. 17, 19, and 22, respectively. FIGS. 18D, 20D, and 23D are sectional views taken along lines D-D' of FIGS. 17, 19, and 22, respectively. FIG. 21 is a plan view illustrating a photomask, which is used to form via holes, according to some example embodiments of inventive concepts.

Referring to FIGS. 17 and 18A to 18D, a logic cell LC may be provided on the substrate SUB. Logic transistors constituting/included in a logic circuit may be disposed on the logic cell LC.

The substrate SUB may include a first active region PR and a second active region NR. In some example embodiment, the first active region PR may be or correspond to a PMOSFET region, and the second active region NR may be or correspond to an NMOSFET region. The substrate SUB may be a semiconductor substrate (e.g., made of silicon, germanium, or silicon-germanium) or a substrate made of a compound semiconductor material such as a III-V material. As an example, the substrate SUB may be a silicon wafer.

The first and second active regions PR and NR may be defined by a second trench TR2, which is formed in an upper portion of the substrate SUB. The second trench TR2 may be placed between the first active region PR and the second active region NR. The first and second active regions PR and NR may be spaced apart from each other, in the first direction D1, with the second trench TR2 interposed therebetween. Each of the first and second active regions PR and NR may be extended in the second direction D2 crossing the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be portions of the substrate SUB, which have a vertically protruding shape. A first trench TR1 may be defined between adjacent ones of the first active patterns AP1 and between adjacent ones of the second active patterns AP2. The first trench TR1 may be shallower than the second trench TR2.

A device isolation layer ST may be formed to fill first and second trenches TR1 and TR2. The device isolation layer ST may include a silicon oxide layer such as high-density plasma (HDP) silicon oxide and/or spin-on glass (SOG) silicon oxide. Upper portions of the first and second active patterns AP1 and AP2 may have a shape vertically protruding above the device isolation layer ST (e.g., see FIG. 18D). Each of the upper portions of the first and second active patterns AP1 and AP2 may be a fin-shaped pattern. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided on the upper portions of the first active patterns AP1. The first source/drain patterns SD1 may be impurity regions of, e.g. doped with or implanted with, a first conductivity type (e.g., p-type). A first channel pattern CH1 may be interposed between a pair of the first source/drain patterns SD1. Second source/drain patterns SD2 may be provided on the upper portions of the second active patterns AP2. The second source/drain patterns SD2 may be impurity regions of, e.g. doped with or implanted with, a second conductivity type (e.g., n-type). A second channel pattern CH2 may be interposed between a pair of the second source/drain patterns SD2.

The first and second source/drain patterns SD1 and SD2 may be or include heterogeneous or homogenous epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may be formed of or include a semiconductor material (e.g., SiGe) whose lattice constant is larger than a lattice constant of the semiconductor material of the substrate SUB. Accordingly, the first source/drain patterns SD1 may exert a compressive stress on the first channel patterns CH1. As an example, the second source/drain patterns SD2 may be formed of or include the same semiconductor material (e.g., Si) as the substrate SUB.

Gate electrodes GE may be provided crossing the first and second active patterns AP1 and AP2 and extending in the first direction D1. The gate electrodes GE may be arranged at a constant pitch in the second direction D2. The gate electrodes GE may be overlapped with the first and second channel patterns CH1 and CH2, when viewed in a plan view. Each of the gate electrodes GE may be provided to face or enclose a top surface and opposite side surfaces of each of the first and second channel patterns CH1 and CH2.

Referring back to FIG. 18D, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. For example, the transistor according to the present embodiment may be a three-dimensional field-effect transistor (e.g., FinFET), in which the gate electrode GE is provided to three-dimensionally surround the channel patterns CH1 and CH2.

Referring back to FIGS. 17 and 18A to 18D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than the top surfaces of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. As another example, the gate spacers GS may include a multi-layer containing at least two of SiCN, SiCON, or SiN.

A gate capping pattern GP may be provided on each of the gate electrodes GE. The gate capping pattern GP may be extended along the gate electrode GE or in the first direction D1. The gate capping pattern GP may include a material having an etch selectivity with respect to first and second interlayer insulating layers 110 and 120, which will be described below. In detail, gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may be extended along a bottom surface of the gate electrode GE thereon. As an example, the gate dielectric pattern GI may cover the first top surface TS1 and the first side surface SW1 of the first channel pattern CH1. The gate dielectric pattern GI may cover the second top surface TS2 and opposite second side surfaces SW2 of the second channel pattern CH2. The gate dielectric pattern GI may cover the top surface of the device isolation layer ST below the gate electrode GE (e.g., see FIG. 18D).

In some example embodiment, the gate dielectric pattern GI may be formed of or include at least one of high-k dielectric materials whose dielectric constants are higher than that of silicon oxide. As an example, the high-k dielectric materials may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work-function metal, which can be used to adjust a threshold voltage of the transistor. By adjusting a thickness and/or composition of the first metal pattern, it may be possible to realize a transistor having a desired threshold voltage.

The first metal pattern may include a metal nitride layer. For example, the first metal pattern may include at least one metal, which is selected from the group consisting of or including titanium (Ti), tantalum (Ta), aluminum (Al), tungsten (W), and molybdenum (Mo), and nitrogen (N). The first metal pattern may further contain carbon (C). The first metal pattern may include a plurality of stacked work-function metal layers.

The second metal pattern may include a metallic material, whose resistance is lower than the first metal pattern. For example, the second metal pattern may include at least one metal selected from the group consisting of or including tungsten (W), aluminum (Al), titanium (Ti), and tantalum (Ta).

A first interlayer insulating layer 110 may be provided on the substrate SUB. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover the gate capping patterns GP.

A pair of division structures DB, which are opposite to each other in the second direction D2, may be provided at both sides of the logic cell LC. The division structure DB may be extended in the first direction D1 and parallel to the gate electrodes GE.

The division structure DB may be provided to penetrate the first and second interlayer insulating layers 110 and 120 and may be extended into the first and second active patterns AP1 and AP2. The division structure DB may penetrate the upper portion of each of the first and second active patterns AP1 and AP2. The division structure DB may separate the first and second active regions PR and NR of the logic cell LC from the active region of a neighboring logic cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed in a self-aligned manner using the gate capping pattern GP and the gate spacer GS. For example, the active contact AC may cover at least a portion of the side surface of the gate spacer GS. The active contacts AC may be formed of or include doped or undoped polysilicon and/or metal such as tungsten; however, example embodiments are not limited thereto.

Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 and SD2 through the silicide pattern SC. The silicide pattern SC may be formed of or include at least one of metal silicide materials (e.g., titanium-silicide, tantalum-silicide, tungsten-silicide, nickel-silicide, and cobalt-silicide).

A gate contact GC, which is electrically connected to the gate electrode GE, may be provided to penetrate the second interlayer insulating layer 120 and the gate capping pattern GP. Referring to FIG. 18B, an upper region of each of the active contacts AC adjacent to the gate contact GC may be filled with an upper insulating pattern UIP. Accordingly, it may be possible to prevent or reduce the likelihood of the gate contact GC from being in contact with the active contact AC adjacent thereto and thereby prevent or reduce the likelihood of a short circuit issue from occurring.

Each of or at least one of the active contact AC and the gate contact GC may include a conductive pattern FM and a barrier pattern BM, which is provided to enclose the conductive pattern FM. For example, the conductive pattern FM may be formed of or include at least one of metallic materials (e.g., aluminum, copper, tungsten, molybdenum, and cobalt). The barrier pattern BM may cover the side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Referring to FIGS. 19 and 20A to 20D, a third interlayer insulating layer 130 may be formed on the second interlayer insulating layer 120. The third interlayer insulating layer 130 may be patterned to form via holes VIH. Each of the via holes VIH may be formed to penetrate the third interlayer insulating layer 130 and to expose the top surface of the active or gate contact AC or GC.

Referring to FIG. 21, the via holes VIH may be formed by a photolithography process, in which the photomask 1400 of FIG. 21 is used. The formation of the photomask 1400 of FIG. 21 may include performing the OPC process previously described with reference to FIGS. 4 to 14.

The image patterns IM of the photomask 1400 may include the first image patterns IM1 and the second image patterns IM2. As described above, the second image patterns IM2 may be patterns formed by the first OPC operation according to some example embodiments of inventive concepts, and the first image patterns IM1 may be patterns formed by the additional OPC operation according to some example embodiments of inventive concepts.

Referring to FIGS. 22 and 23A to 23D, first vias VI1 may be formed by filling the via holes VIH with a conductive material. A fourth interlayer insulating layer 140 may be formed on the third interlayer insulating layer 130. Interconnection lines M1_R1, M1_R2, and M1_I may be formed in the fourth interlayer insulating layer 140. The interconnection lines M1_R1, M1_R2, and M1_I may include a first power line M1_R1, a second power line M1_R2, and lower interconnection lines M1_I.

Referring to FIG. 22, each of the first power line M1_R1 and the second power line M1_R2 may be extended in the second direction D2 to cross the logic cell LC. In an embodiment, a plurality of the lower interconnection lines M1_I may be disposed between the first and second lower power lines M1_R1 and M1_R2. The lower interconnection lines M1_I may be line- or bar-shaped patterns extending in the second direction D2.

The interconnection lines M1_R1, M1_R2, and M1_I and the first vias VI1 thereunder may constitute or correspond to a first metal layer M1. The first via VI1 may be interposed between the interconnection line and the active or gate contact AC or GC to electrically connect them to each other. Although not shown, additional metal layers (e.g., M2, M3, M4, and so forth) may be formed on the first metal layer M1.

Figure 25:
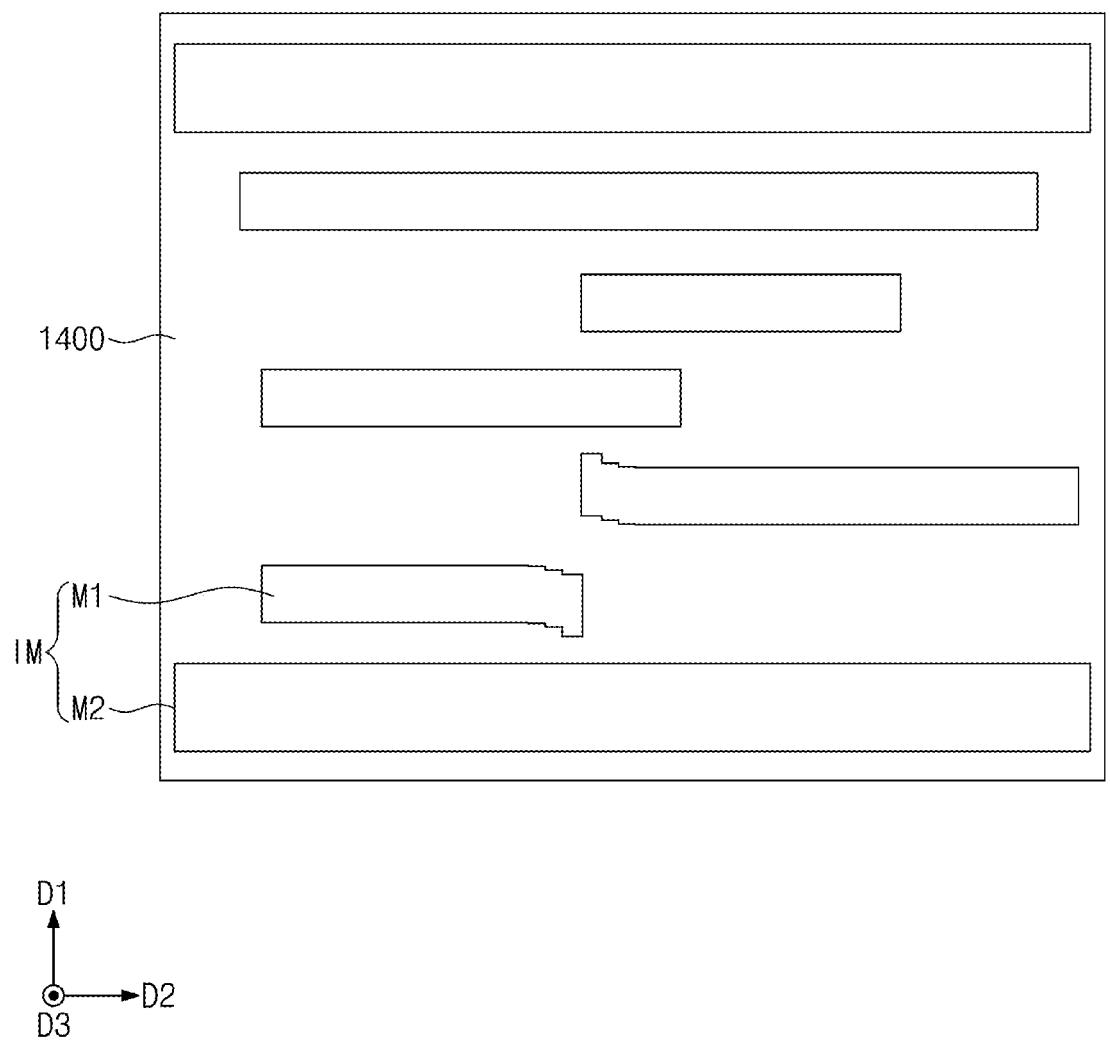
FIG. 25 is a plan view illustrating a photomask, which is used to form interconnection lines, according to some example embodiments of inventive concepts.

According to some example embodiments of inventive concepts, the interconnection lines M1_R1, M1_R2, and M1_I may be formed by a photolithography process using the photomask 1400 of FIG. 25. The formation of the photomask 1400 of FIG. 25 may include may include performing the OPC process previously described with reference to FIGS. 4 to 14.

Figure 24:
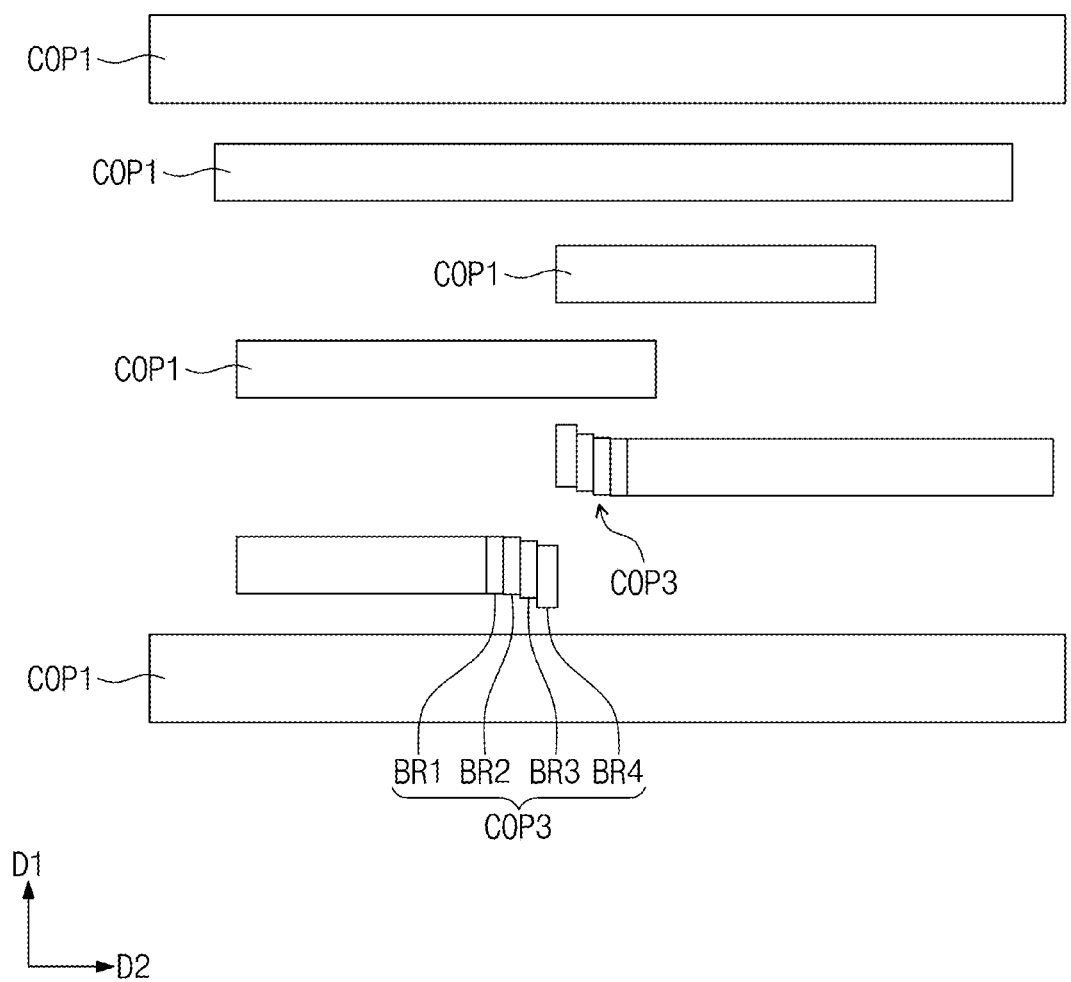
FIG. 24 is a plan view illustrating a second layout according to some example embodiments of inventive concepts.

In detail, FIG. 24 illustrates a second layout LO2. The second layout LO2 may be a final layout prepared through the optical proximity correction of FIG. 4. The second layout LO2 may include the first correction patterns COP1, which are generated by performing the first OPC operation. The second layout LO2 may further include the third correction patterns COP3, which are generated by performing the second OPC operation, the block dividing operation, and the block correcting operation. For example, the third correction pattern COP3 may include a plurality of blocks BR1-BR4.

The photomask 1400 of FIG. 25 may be manufactured/taped out based on the second layout LO2 of FIG. 24 which is prepared through the optical proximity correction according to some example embodiments of inventive concepts.

The photomask 1400 of FIG. 25 may include the image patterns IM. The first image patterns IM1 of the image patterns IM may be patterns that are formed using the third correction patterns COP3 of FIG. 24. The second image patterns IM2 of the image patterns IM may be patterns that are formed using the first correction patterns COP1 of FIG. 24.

The optical proximity correction method according to some example embodiments of inventive concepts may be applied to a method of forming island-shaped patterns (e.g., contacts or vias) shown in FIG. 21. In addition, the optical proximity correction method according to some example embodiments of inventive concepts may be applied to a method of forming line patterns (e.g., interconnection lines) shown in FIG. 25. Especially, in the case where, due to a small distance between line ends, there is restriction of the mask rule, the optical proximity correction method may be effectively used.

In an OPC method according to some example embodiments of inventive concepts, an OPC operation may be performed without restriction of a mask rule and thus may have a technical advantage in that it is relatively free from the mask rule. In the OPC method, object patterns may be chosen, and the OPC operation may be selectively and more precisely performed on only the chosen object patterns. An additional OPC operation may be selectively applied to only patterns, for which an additional correction is required, and thus, it may be possible to reduce an operation time and to realize an efficient process. Alternatively or additionally, it may be possible to minimize or reduce the impact of a side effect, which may occur in patterns that are not chosen as the object patterns. As a result, it may be possible to improve precision and reliability in a process of fabricating a semiconductor device.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   performing an optical proximity correction (OPC) on design patterns of a layout to generate a corrected layout; and
   forming a photoresist pattern on a substrate using a photomask manufactured based on the corrected layout,
   wherein the OPC comprises,
      generating develop targets for the design patterns, respectively,
      choosing first object patterns based on distances between the develop targets,
      performing a first OPC operation on the design patterns based on a mask rule to generate first correction patterns,
      choosing second object patterns by considering distances between the first correction patterns and a target error of each of the first correction patterns, and
      performing a second OPC operation on the first and second object patterns to generate second correction patterns, the performing the second OPC not based on the mask rule.

2. The method of claim 1, wherein the choosing of the first object patterns comprises comparing the mask rule with the distances between the develop targets.

3. The method of claim 1, wherein the considering of the target error comprises comparing a develop image of the first correction pattern with the develop target corresponding to the first correction pattern.

4. The method of claim 1, wherein distances between the second correction patterns generated through the second OPC operation are less than a mask rule value of the mask rule.

5. The method of claim 1, wherein the second OPC operation is not performed on some of the design patterns which are not chosen as the first and second object patterns.

6. The method of claim 1, wherein the OPC further comprises:
   dividing each of the second correction patterns into a plurality of blocks; and
   generating third correction patterns by correcting the plurality of blocks based on the mask rule.

7. The method of claim 6, wherein the OPC further comprises:

checking for occurrence of a target error for each of the third correction patterns; and
re-correcting the plurality of blocks of the third correction pattern in which the target error occurs,
wherein the checking of the target error of the third correction pattern comprises comparing a develop image of the third correction pattern with the develop target corresponding to the third correction pattern.

8. The method of claim 6, wherein the OPC further comprises:
defining control points in the plurality of blocks; and
assigning a weight to each of the control points.

9. The method of claim 1, further comprising:
forming an active pattern on the substrate;
forming a gate electrode to cross the active pattern;
forming an active contact electrically connected to the active pattern;
forming a gate contact electrically connected to the gate electrode; and
forming an interlayer insulating layer on the active contact and on the gate contact;
wherein the forming the photoresist pattern on the substrate using the photomask includes patterning the interlayer insulating layer to form via holes exposing the active and gate contacts, respectively.

10. The method of claim 1, further comprising:
forming an active pattern on the substrate;
forming a gate electrode to cross the active pattern;
forming an active contact electrically connected to the active pattern;
forming a gate contact electrically connected to the gate electrode;
forming an interlayer insulating layer on the active contact and the gate contact; and
forming interconnection lines, which are electrically connected to the active and gate contacts, in the interlayer insulating layer,
wherein the forming the photoresist pattern on the substrate using the photomask includes patterning a mask to form the interconnection lines.

11. A method of fabricating a semiconductor device, comprising:
performing an optical proximity correction (OPC) on design patterns of a layout to generate a corrected layout; and
forming a photoresist pattern on a substrate, using a photomask manufactured based on the corrected layout,
wherein the OPC comprises,
choosing object patterns from the design patterns,
performing an OPC operation on the object patterns to generate first correction patterns, the performing the OPC operation not based on a mask rule,
dividing each of the first correction patterns into a plurality of blocks, and
correcting the plurality of blocks based on the mask rule to generate second correction patterns.

12. The method of claim 11, wherein the OPC further comprises:
checking for occurrence of a target error for each of the second correction patterns; and
re-correcting the plurality of blocks of the second correction pattern in which the target error occurs.

13. The method of claim 12, wherein the checking of the target error comprises comparing a develop image of the second correction pattern with a develop target.

14. The method of claim 11, wherein the OPC further comprises:
defining at least one control point in the plurality of blocks; and
assigning a weight to each of the at least one control point.

15. The method of claim 11, further comprising:
forming an active pattern on the substrate;
forming a gate electrode to cross the active pattern;
forming an active contact electrically connected to the active pattern;
forming a gate contact electrically connected to the gate electrode;
forming an interlayer insulating layer on the active contact and the gate contact; and
patterning the interlayer insulating layer to form via holes exposing the active and gate contacts, respectively,
wherein the forming the photoresist pattern on the substrate using the photomask includes defining a mask used to form the via holes.

16. A method of fabricating a semiconductor device, comprising:
forming an active pattern on a substrate;
forming a pair of source/drain patterns on an upper portion of the active pattern;
forming a gate electrode to cross the active pattern between the pair of source/drain patterns;
forming a first interlayer insulating layer to cover the pair of source/drain patterns and the gate electrode;
forming an active contact to penetrate the first interlayer insulating layer and to be coupled to at least one of the pair of source/drain patterns;
forming a gate contact to penetrate the first interlayer insulating layer and to be coupled to the gate electrode;
forming a second interlayer insulating layer on the first interlayer insulating layer;
patterning the second interlayer insulating layer to form via holes respectively exposing a top surface of the active contact and a top surface of the gate contact;
filling the via holes with a conductive material to form vias; and
forming interconnection lines, which are connected to the vias, on the second interlayer insulating layer,
wherein (A) the forming of the via holes includes,
designing a layout in which design patterns defining the vias are included,
performing an optical proximity correction (OPC) on the designed layout to generate a corrected layout, and
performing a photolithography process on the second interlayer insulating layer using a photomask manufactured based on the corrected layout, and
wherein (B) the OPC includes,
generating develop targets for the design patterns,
choosing first object patterns based on distances between the develop targets,
performing a first OPC operation on the design patterns based on a mask rule to generate first correction patterns,
choosing second object patterns by considering distances between the first correction patterns and a target error of each of them, and
performing a second OPC operation on the first and second object patterns, without being based on the mask rule, to generate second correction patterns.

17. The method of claim 16, wherein the second OPC operation is not performed on some of the design patterns which are not chosen as the first and second object patterns.

18. The method of claim 16, wherein the OPC further comprises:
- dividing each of the second correction patterns into a plurality of blocks; and
- generating third correction patterns by correcting the plurality of blocks based on the mask rule.

19. The method of claim 18, wherein the OPC further comprises:
- checking for occurrence of a target error for each of the third correction patterns; and
- re-correcting the plurality of blocks of the third correction pattern, in which the target error occurs.

20. The method of claim 19, wherein the checking of the target error of the third correction pattern comprises comparing a develop image of the third correction pattern with the develop target corresponding to the third correction pattern.

* * * * *